US009123747B2

(12) United States Patent
Sonehara et al.

(10) Patent No.: US 9,123,747 B2
(45) Date of Patent: Sep. 1, 2015

(54) NONVOLATILE SEMICONDUCTOR MEMORY DEVICE AND MANUFACTURING METHOD THEREOF

(71) Applicant: KABUSHIKI KAISHA TOSHIBA, Tokyo (JP)

(72) Inventors: Takeshi Sonehara, Mie (JP); Takeshi Murata, Mie (JP); Junya Fujita, Mei (JP); Fumiki Aiso, Mie (JP); Saku Hashiura, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/195,022

(22) Filed: Mar. 3, 2014

(65) Prior Publication Data
US 2015/0041815 A1 Feb. 12, 2015

(30) Foreign Application Priority Data

Aug. 9, 2013 (JP) .................................. 2013-166588

(51) Int. Cl.
| H01L 29/788 | (2006.01) |
| H01L 29/66 | (2006.01) |
| H01L 21/28 | (2006.01) |
| H01L 27/115 | (2006.01) |
| H01L 29/51 | (2006.01) |

(52) U.S. Cl.
CPC .... *H01L 29/66825* (2013.01); *H01L 21/28273* (2013.01); *H01L 27/11529* (2013.01); *H01L 27/11534* (2013.01); *H01L 29/513* (2013.01); *H01L 29/518* (2013.01); *H01L 29/7881* (2013.01)

(58) Field of Classification Search
CPC .................. H01L 29/66825; H01L 29/788
USPC ............................. 257/315; 438/201
See application file for complete search history.

(56) References Cited

U.S. PATENT DOCUMENTS

| 5,650,649 | A | 7/1997 | Tsukiji |
| 5,814,855 | A | 9/1998 | Arase et al. |
| 5,880,498 | A * | 3/1999 | Kinoshita et al. ............. 257/315 |
| 6,078,075 | A | 6/2000 | Widdershoven |
| 6,300,664 | B1 | 10/2001 | Kuroi et al. |
| 6,573,140 | B1 * | 6/2003 | Ogura et al. ................. 438/261 |
| 6,703,298 | B2 * | 3/2004 | Roizin et al. ................. 438/593 |
| 8,803,220 | B2 * | 8/2014 | Orimoto et al. ............. 257/319 |

(Continued)

FOREIGN PATENT DOCUMENTS

| JP | 08-306888 | 11/1996 |
| JP | 2000-299395 A | 10/2000 |

(Continued)

OTHER PUBLICATIONS

Kwok K. NG "Complete Guide to Semiconductor Devices" 2nd edition, 2002, John Wiley & Sons, Inc., Appendix D2.*

*Primary Examiner* — Allan R Wilson
(74) *Attorney, Agent, or Firm* — Patterson & Sheridan, LLP

(57) ABSTRACT

According to one embodiment, a plurality of memory cell transistors including a floating gate and a control gate and a plurality of peripheral circuit transistors including a lower electrode portion and an upper electrode portion are included. The floating gate includes a first polysilicon region, and the lower electrode includes a second polysilicon region. The first polysilicon region is a p-type semiconductor in which boron is doped, and the second polysilicon region is an n-type semiconductor in which phosphorus and boron are doped.

11 Claims, 19 Drawing Sheets

(56) References Cited

U.S. PATENT DOCUMENTS

| | | |
|---|---|---|
| 2010/0006915 A1* | 1/2010 | Lee et al. ............... 257/315 |
| 2011/0001181 A1* | 1/2011 | Ju et al. ............... 257/321 |
| 2011/0122698 A1 | 5/2011 | Izumida et al. |
| 2012/0061731 A1 | 3/2012 | Hagishima et al. |
| 2012/0126306 A1 | 5/2012 | Kawaguchi et al. |
| 2012/0132985 A1 | 5/2012 | Kai et al. |
| 2012/0228691 A1* | 9/2012 | Dunga et al. ............... 257/315 |
| 2014/0264531 A1* | 9/2014 | Goyo et al. ............... 257/316 |
| 2014/0312403 A1* | 10/2014 | Sel et al. ............... 257/315 |

FOREIGN PATENT DOCUMENTS

| | | |
|---|---|---|
| JP | 2003-060075 A | 2/2003 |
| JP | 2003-068888 A | 3/2003 |
| JP | 2005-235987 A | 9/2005 |

* cited by examiner

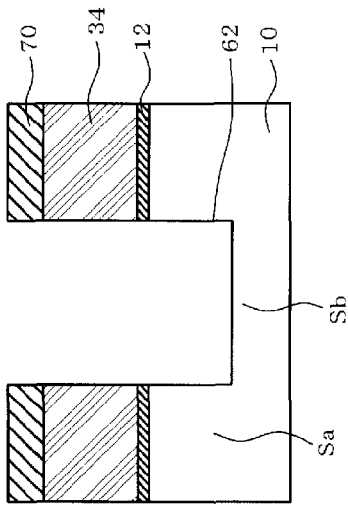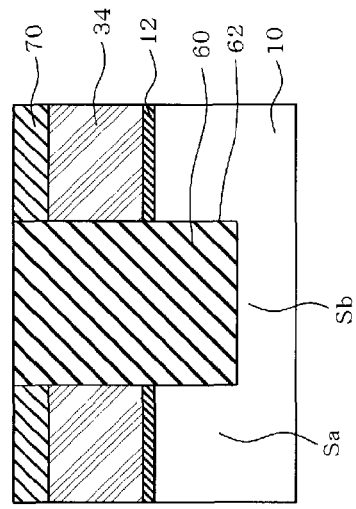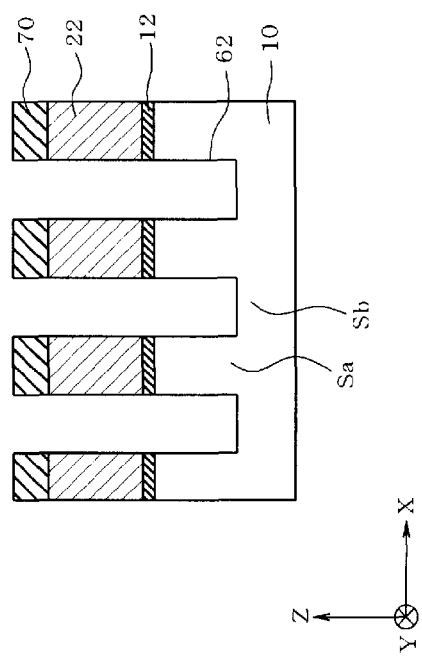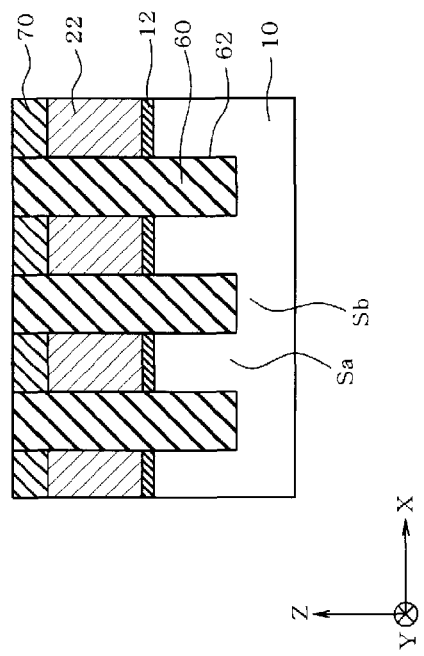

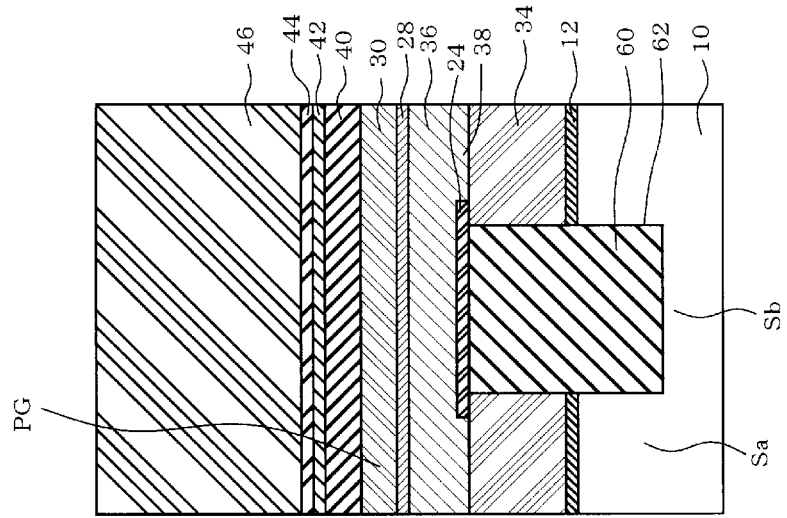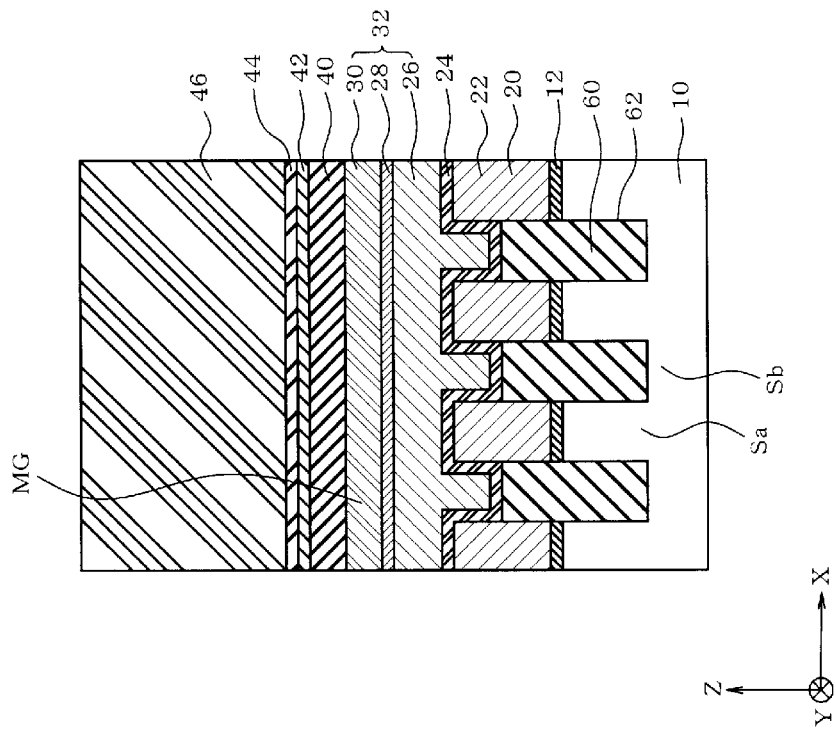

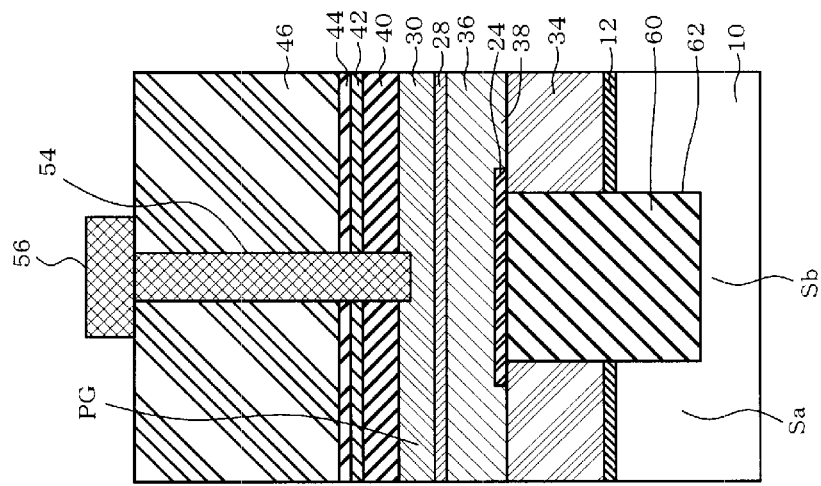
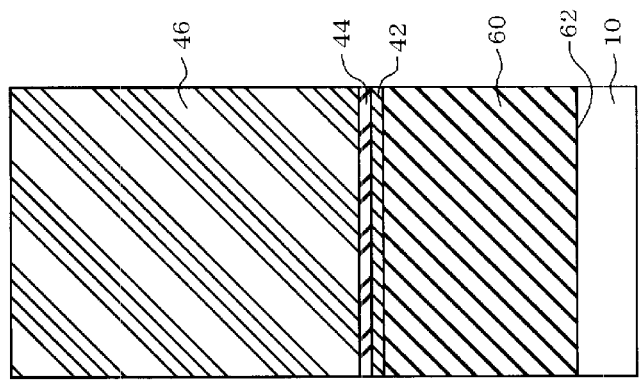
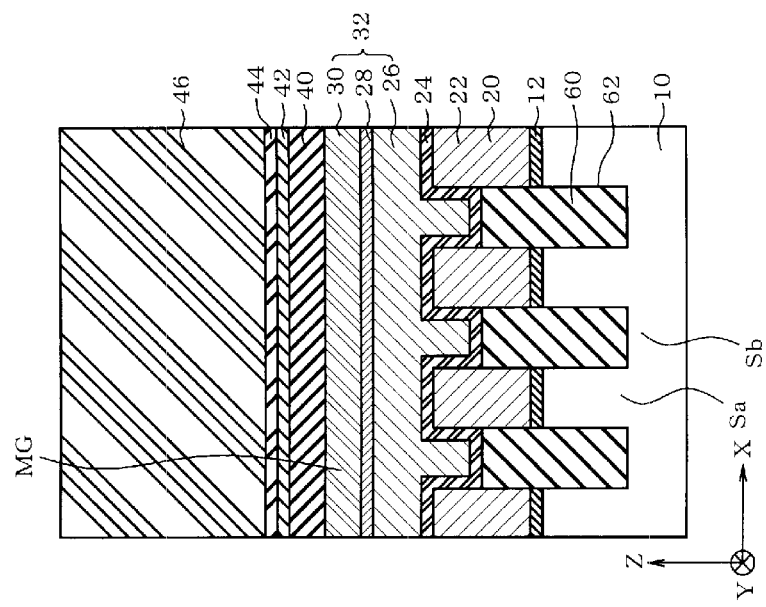

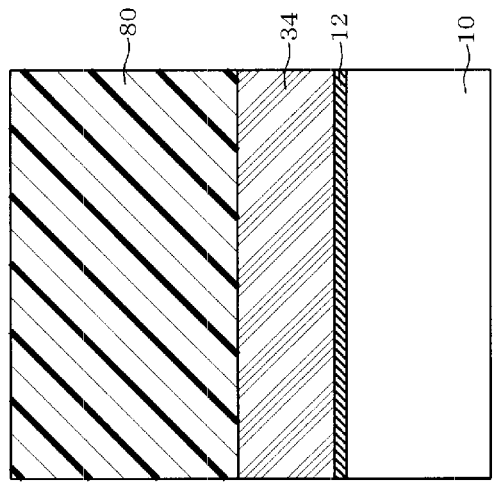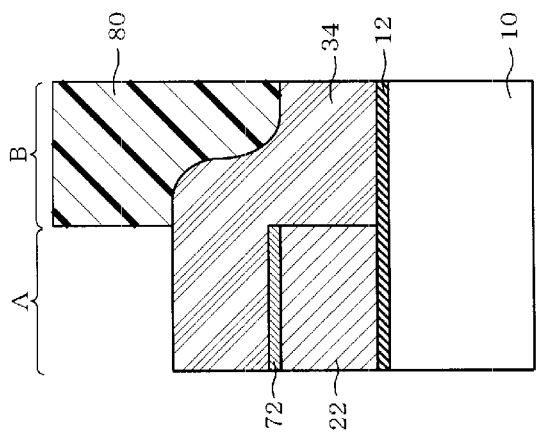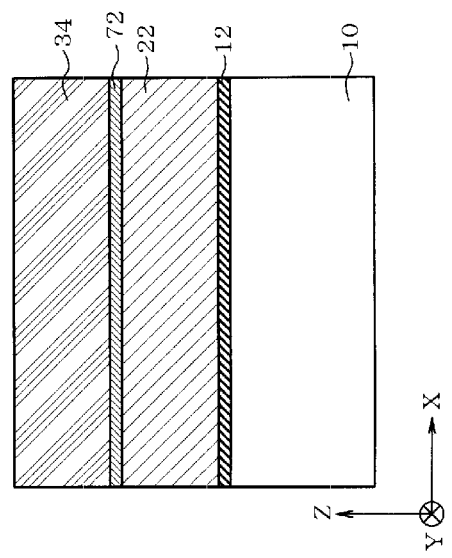

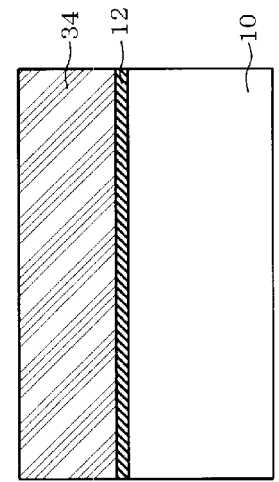
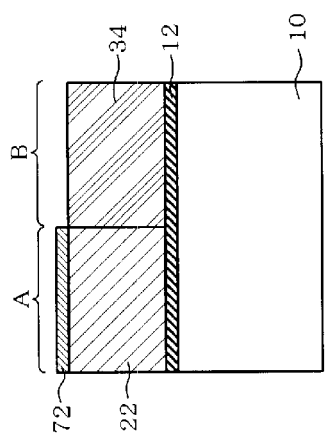
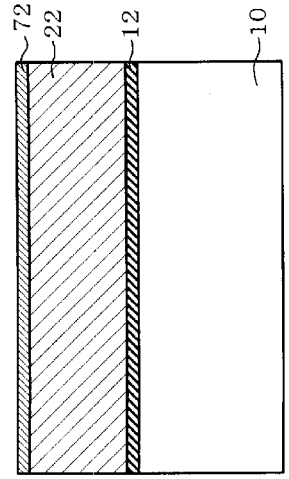
FIG. 18A  FIG. 18B  FIG. 18C
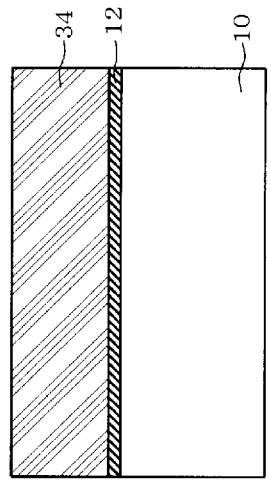
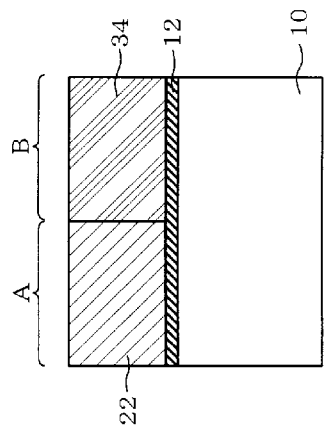
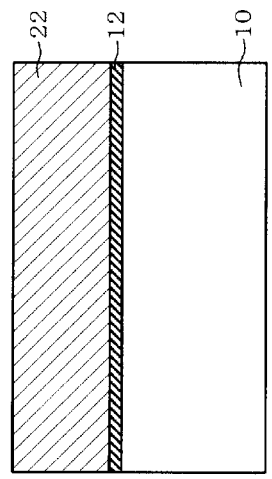
FIG. 19A  FIG. 19B  FIG. 19C

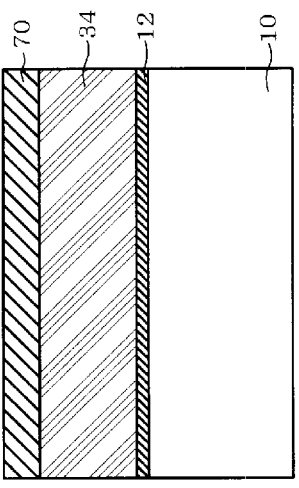 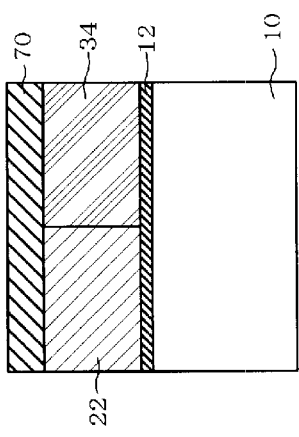 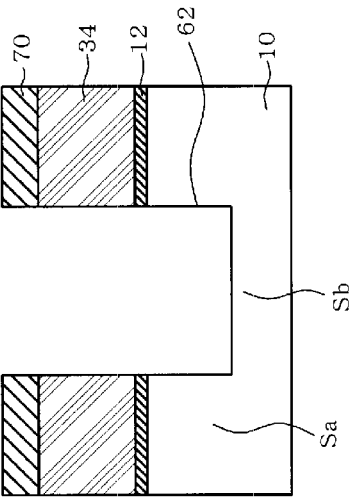 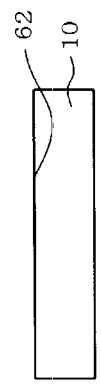
FIG. 20A  FIG. 20B  FIG. 20C
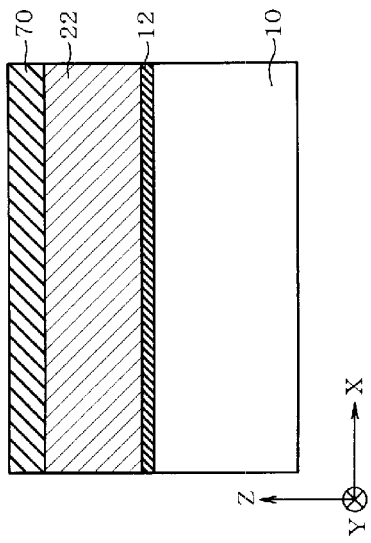 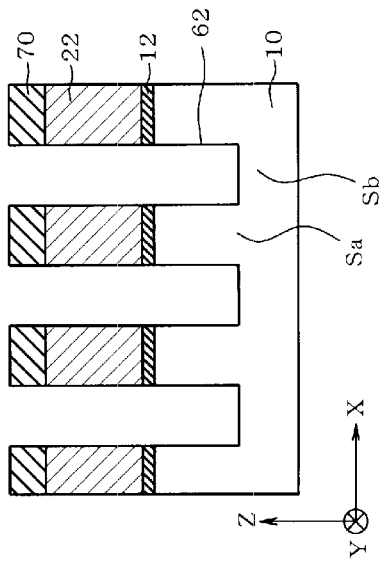
FIG. 21A  FIG. 21B  FIG. 21C

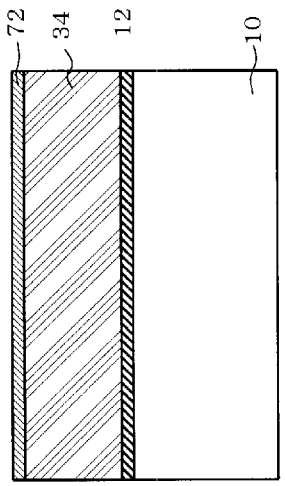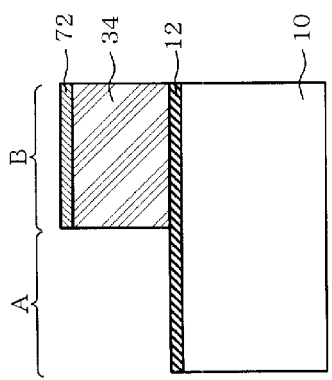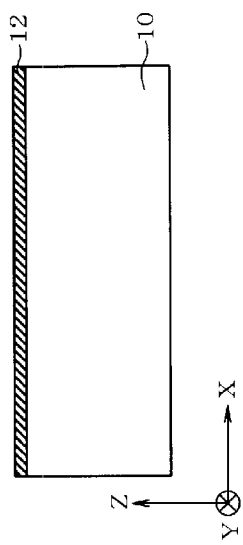

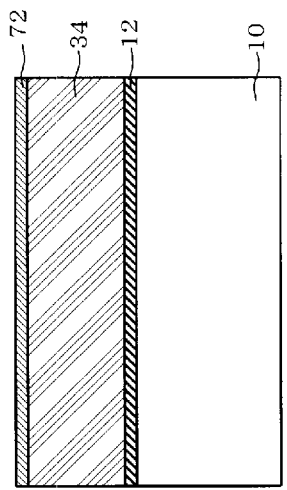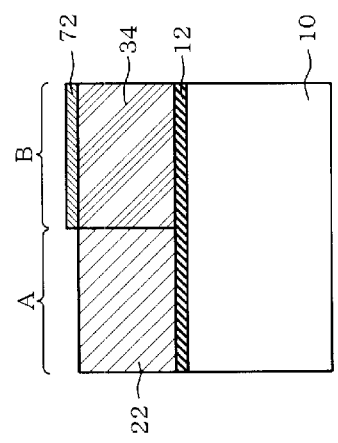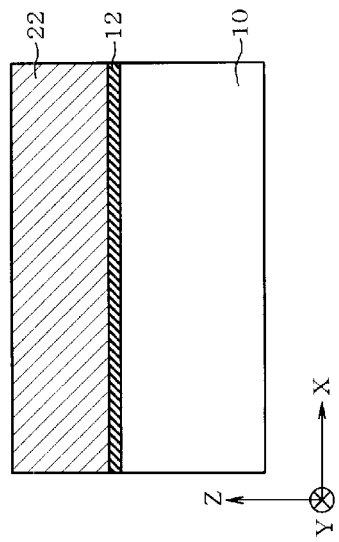

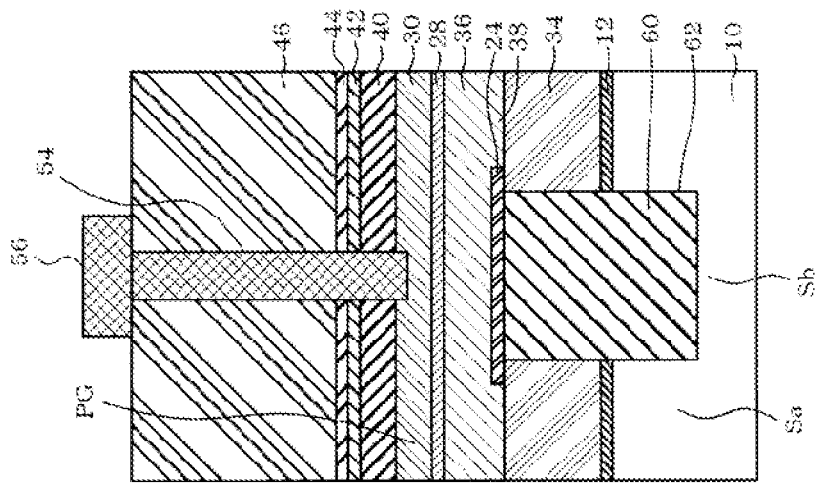
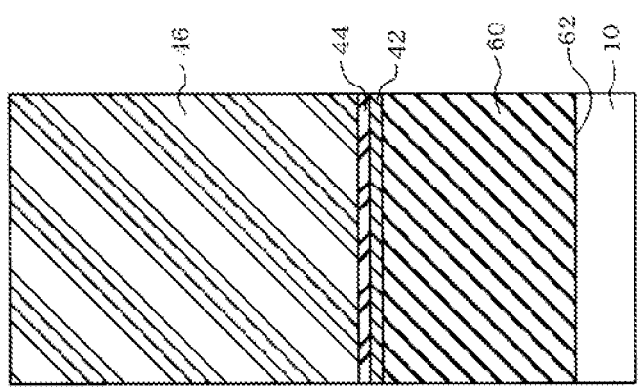
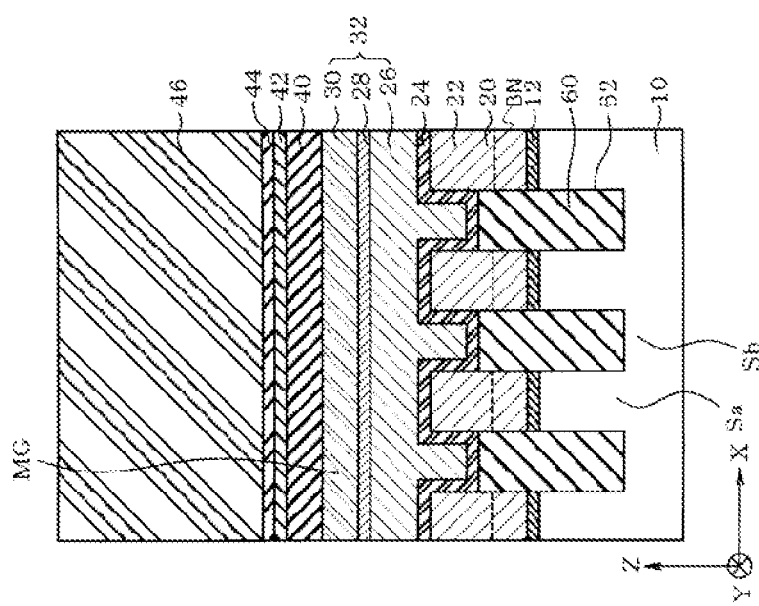

NONVOLATILE SEMICONDUCTOR MEMORY DEVICE AND MANUFACTURING METHOD THEREOF

CROSS-REFERENCE TO RELATED APPLICATION

This application is based upon and claims the benefit of priority from Japanese Patent Application No. 2013-166588, filed Aug. 9, 2013, the entire contents of which are incorporated herein by reference.

FIELD

Embodiments described herein relate generally to a nonvolatile semiconductor memory device and a manufacturing method thereof.

BACKGROUND

A floating gate (FG) type structure is typically employed in a cell structure of a NAND-type flash memory, for example, which is part of a nonvolatile semiconductor memory device. In the FG type structure, the operation window of a memory device is wide and its ability to store charge is excellent.

However, in recent years, cells are being shrunk and it is hard to adjust the physical and/or electrical properties of a memory cell transistor and the physical and/or electrical properties of a transistor of a peripheral circuit at the same time.

DESCRIPTION OF THE DRAWINGS

FIGS. 7A and 7B are an example of longitudinal cross-sectional views showing an intermediate step for describing a manufacturing step of a NAND-type flash memory device of the first embodiment.

FIGS. 8A and 8B are an example of longitudinal cross-sectional views showing an intermediate step for describing a manufacturing step of a NAND-type flash memory device of the first embodiment.

FIGS. 11A and 11B are an example of longitudinal cross-sectional views showing an intermediate step for describing a manufacturing step of a NAND-type flash memory device of the first embodiment.

FIG. 14A is an example of a longitudinal cross-sectional view schematically showing a cross-sectional structure of a memory cell transistor taken along section line 4A-4A of FIG. 2.

FIG. 14B is an example of a longitudinal cross-sectional view schematically showing a cross-sectional structure of a boundary region.

FIG. 14C is an example of a longitudinal cross-sectional view schematically showing a cross-sectional structure of a peripheral circuit transistor taken along section line 4B-4B of FIG. 3.

FIGS. 17A to 17C are an example of longitudinal cross-sectional views showing an intermediate step for describing a manufacturing step of a NAND-type flash memory of the second embodiment.

FIGS. 18A to 18C are an example of longitudinal cross-sectional views showing an intermediate step for describing a manufacturing step of a NAND-type flash memory of the second embodiment.

FIGS. 19A to 19C are an example of longitudinal cross-sectional views showing an intermediate step for describing a manufacturing step of a NAND-type flash memory of the second embodiment.

FIGS. 20A to 20C are an example of longitudinal cross-sectional views showing an intermediate step for describing a manufacturing step of a NAND-type flash memory of the second embodiment.

FIGS. 21A to 21C are an example of longitudinal cross-sectional views showing an intermediate step for describing a manufacturing step of a NAND-type flash memory of the second embodiment.

FIGS. 24A to 24C are an example of longitudinal cross-sectional views showing an intermediate step for describing a manufacturing step of a NAND-type flash memory of the third embodiment.

FIGS. 26A to 26C are an example of longitudinal cross-sectional views showing an intermediate step for describing a manufacturing step of a NAND-type flash memory of the third embodiment.

FIG. 27A to 27C is an example of a longitudinal cross-sectional view schematically showing dividing layer.

DETAILED DESCRIPTION

Embodiments provide a nonvolatile semiconductor memory device having a memory region and a peripheral circuit region that have electric properties that can be adjusted to a target value at the same time.

In general, according to one embodiment, a nonvolatile semiconductor memory device is provided that includes memory cell transistors including a floating gate and a control gate, and peripheral circuit transistors including a lower electrode portion and an upper electrode portion. The floating gate includes a first polysilicon region, and the lower electrode includes a second polysilicon region. The first polysilicon region is a p-type semiconductor in which boron (B) is doped, and the second polysilicon region, is an n-type semiconductor in which phosphorus (P) and boron (B) are doped.

According to another embodiment, there is provided a manufacturing method of a nonvolatile semiconductor memory device that includes: memory cell transistors including a floating gate and a control gate, and peripheral circuit transistors including a lower electrode portion and an upper electrode portion. The floating gate includes a first polysilicon region, and the lower electrode includes a second polysilicon region. A step of doping an n-type impurity in the second polysilicon region is included before a step of doping a p-type impurity in the first polysilicon region and the second polysilicon region.

First Embodiment

Hereinafter, a NAND-type flash memory device of a nonvolatile semiconductor memory device is described with reference to FIGS. 1 to 13. The drawings are schematically shown and a relationship between a thickness and a planar dimension, a ratio of a thickness of each layer, and the like do not necessarily coincide with actual values. In addition, up, down, right, and left directions show relative directions when a circuit forming surface side of a semiconductor substrate which will be described later is set to an upper side, and do not necessarily coincide with examples having a gravity acceleration direction as a reference. In the following description, an XYZ orthogonal coordinate system may be used for convenience of the description. In the coordinate system, two directions which are parallel with respect to a surface (main flat surface) of a semiconductor substrate 10 and which are orthogonal with each other are an X direction and a Y direction, and a direction which is orthogonal with respect to both of the X direction and the Y direction is a Z direction.

Figure 1:
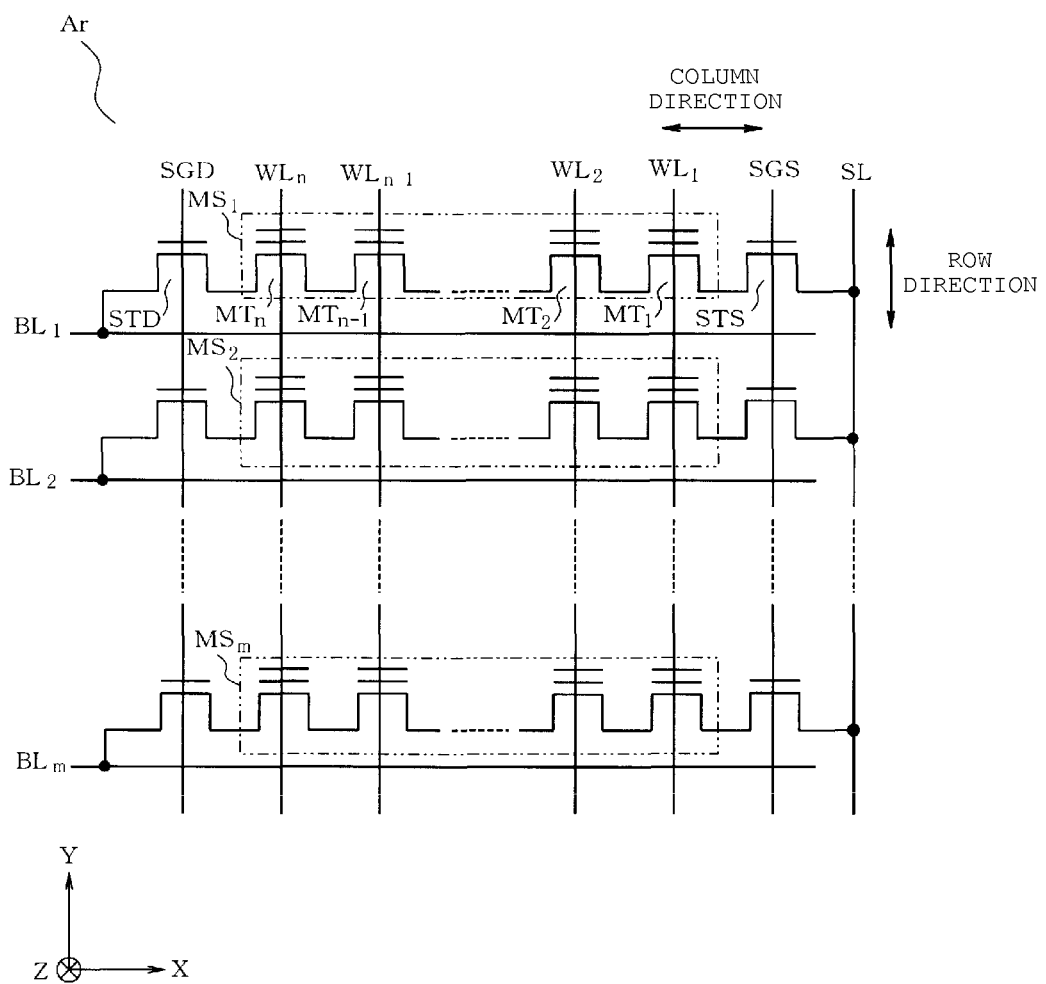
FIG. 1 is an example of a view schematically showing an electrical configuration of a memory cell region of a NAND-type flash memory device according to an embodiment.

FIG. 1 is an example of a view showing an equivalent circuit of a cell array Ar of a NAND-type flash memory device 1. As shown in FIG. 1, the cell array Ar includes data selection lines $WL_1$ to $WL_n$ (n is an integer equal to or larger than 1) and data transfer lines $BL_1$ to $BL_m$ (m is an integer equal to or larger than 1) which intersect with each other. The data selection lines $WL_1$ to $WL_n$ extend in a Y direction (row direction) in the drawing, respectively, and are disposed to be parallel with each other in an X direction. The data transfer lines $BL_1$ to $BL_m$ extend in the X direction (column direction) in the drawing, respectively, and are disposed to be parallel with each other in the Y direction. The cell array Ar includes a source line SL, a source side selection gate line SGS, and a drain side selection gate line SGD which extend in a direction parallel with the data selection lines $WL_1$ to $WL_n$, that is the Y direction (row direction) in the drawing. The cell array Ar includes memory strings $MS_1$ to $MS_m$ each of which includes memory cell transistors $MT_1$ to $MT_n$ which are connected to each other in series. A memory cell transistor $MT_i$ (i is an integer from 1 to n) is a transistor having an FG type structure including a control gate electrode and a floating gate electrode. The control gate electrodes of each of the memory cell transistors $MT_1$ to $MT_n$, belonging to each of the memory strings $MS_j$ (j is an integer from 1 to m), are commonly connected to each data selection line $WL_i$. In this example, m memory cell transistors $MT_i$ are commonly connected to the data selection line $WL_i$. The selection transistor STS is connected to one end of each of the memory strings $MS_j$. The memory string $MS_j$ is connected to a source line SL through the selection transistor STS. A selection transistor STD is connected to the other end of each of the memory strings $MS_j$. The memory strings $MS_j$ are connected to the data transfer line $BL_j$ through the selection transistor STD. The gate electrodes of the selection transistors STS and STD are commonly connected to the source side selection gate line SGS and the drain side selection gate line SGD. The m selection transistors STS and STD are commonly connected to each of the source side selection gate line SGS and the drain side selection gate line SGD.

Figure 2:
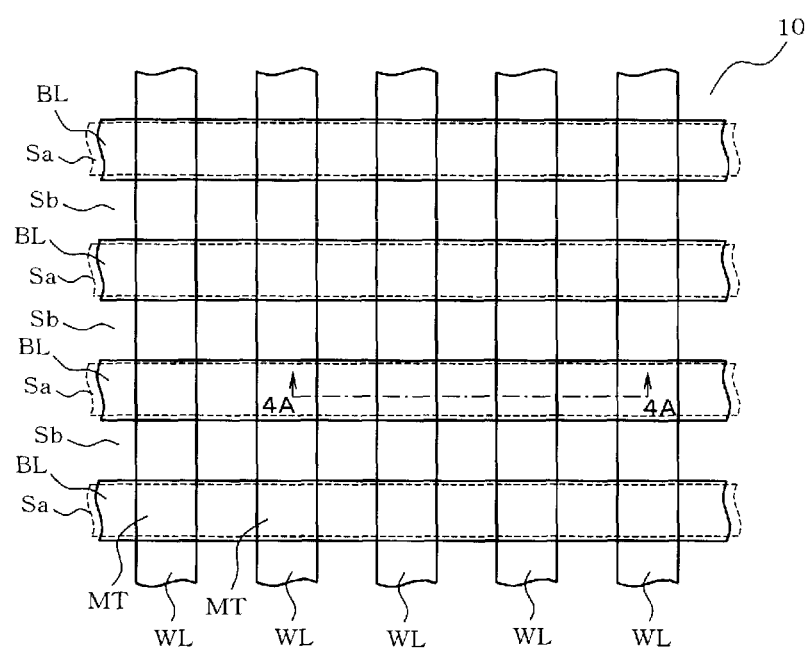
FIG. 2 is an example of a plan view schematically showing a planar layout pattern of a part of a memory cell region.

FIG. 2 is an example of a view schematically showing a planar layout pattern of a part of the cell array Ar. Hereinafter, each of the data transfer lines $BL_1$ to $BL_m$ is referred to as the data transfer line BL, each of the data selection lines $WL_1$ to $WL_n$ is referred to as the data selection line WL, and each of the memory cell transistors $MT_1$ to $MT_n$ is referred to as the memory cell transistor MT.

In FIG. 2, the data transfer lines BL extend in the X direction and are disposed at predetermined intervals to be parallel with each other in the Y direction. An element isolation area Sb having a shallow trench isolation (STI) structure in which an insulating film is embedded in a trench, is formed on the semiconductor substrate 10 to extend in the X direction in the drawing. The element isolation areas Sb are formed at predetermined intervals in the Y direction in the drawing. Accordingly, an element region Sa is formed to extend along the X direction, and the element regions Sa are formed at predetermined intervals in the Y direction, on a surface layer portion of the semiconductor substrate 10. That is, the element isolation area Sb is provided between the element regions Sa, and the element regions Sa are separated from each other by the element isolation area Sb in the semiconductor substrate 10.

The data selection lines WL are formed to extend along a direction (Y direction in FIG. 2) orthogonal to the element region Sa. The data selection lines WL are formed at predetermined intervals in the X direction in the drawing. The memory cell transistors MT are disposed on intersecting portions of the data selection lines WL and the element regions Sa.

The above description is a basic configuration of the cell array Ar of the NAND-type flash memory device 1 to which the first embodiment is applied.

Figure 3:
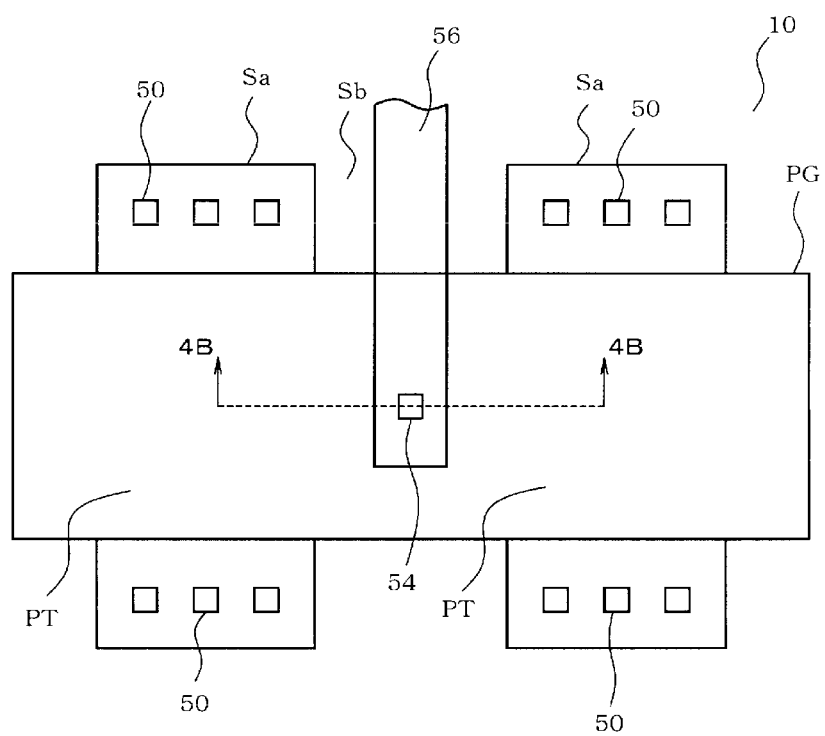
FIG. 3 is an example of a plan view schematically showing a planar layout pattern of a peripheral circuit transistor.

FIG. 3 is an example of a view schematically showing a cross-sectional structure of a peripheral circuit transistor PT. In a peripheral circuit region, as shown in FIG. 3, two element regions Sa, which are defined in a rectangular shape, are formed on a main flat surface of the semiconductor substrate 10 to be adjacent to the element isolation area Sb in an island shape. Herein, the drawing shows an example in which a peripheral gate electrode PG is formed in the X direction so as to cross the center portion of two element isolation Sa, and the end portion thereof is formed on the element isolation area Sb. Contacts 50 are connected to the upper portion of the element regions Sa on both sides of the peripheral gate electrode PG in the Y direction. Contacts 54 are connected on the peripheral gate electrode PG between two element regions Sa. The two peripheral circuit transistors PT are formed on an intersecting portion of the peripheral gate electrode PG and the element region Sa. The two peripheral circuit transistors PT include the common peripheral gate electrode PG.

Next, the basic configuration of the NAND-type flash memory device 1 of the first embodiment will be described with reference to FIGS. 4A to 13.

Figure 4A:
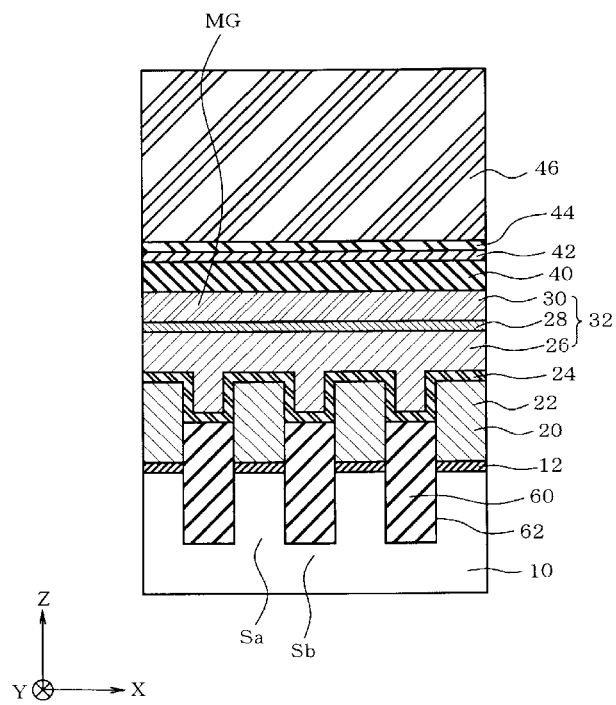
FIG. 4A is an example of a longitudinal cross-sectional view schematically showing a cross-sectional structure of a memory cell transistor, and shows a cross-sectional structure taken along section line 4A-4A of FIG. 2.
Figure 4B:
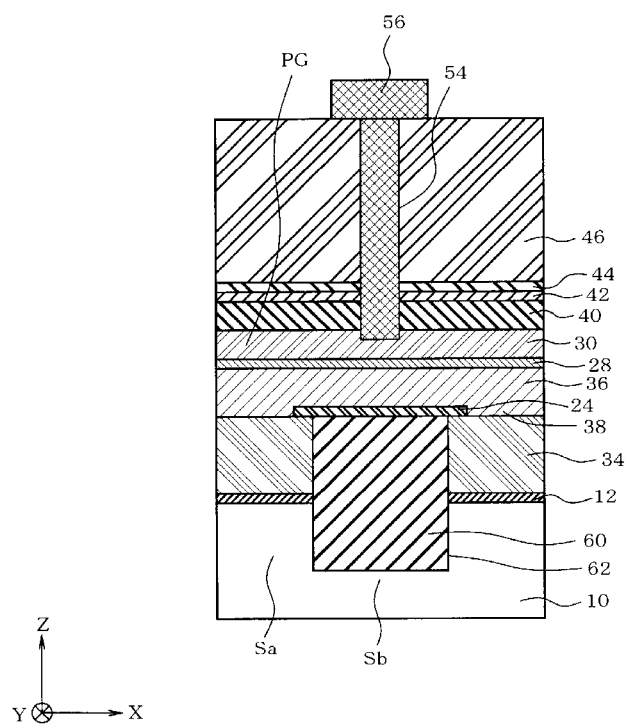
FIG. 4B is an example of a longitudinal cross-sectional view schematically showing a cross-sectional structure of a peripheral circuit transistor taken along line 4B-4B of FIG. 3.

FIG. 4A is an example of a view schematically showing a cross-sectional structure of the memory cell transistor MT taken along line 4A-4A of FIG. 2. FIG. 4B is an example of a view schematically showing a cross-sectional structure of the peripheral circuit transistor PT, and shows a cross-sectional structure taken along line 4B-4B of FIG. 3. FIG. 4B shows a cross-sectional structure of two peripheral circuit transistors PT adjacent to each other in a gate length direction.

In FIG. 4A, the element isolation areas Sb are formed on a surface (main flat surface) of the semiconductor substrate 10. An element isolation groove 62 having a predetermined width and depth is formed in the element isolation area Sb. An element isolation insulating film 60 is filled in the element isolation groove 62. The element region Sa is divided into the regions in the X direction in the drawing by the element isolation area Sb. A memory cell gate electrode MG is provided on the semiconductor substrate 10. The memory cell gate electrode MG includes a floating gate electrode 20, an interelectrode insulating film 24, and a control gate electrode 32, on a gate insulating film 12 provided on the semiconductor substrate 10.

A p-type silicon substrate can be used as the semiconductor substrate 10, for example. In addition, a silicon substrate provided with a p well may be used. The gate insulating film 12 is formed with a silicon oxide film or an oxynitride film, for example, and is used as a tunnel insulating film. The floating gate electrode 20 includes a first polysilicon film 22. The control gate electrode 32 includes a second polysilicon film 26, a barrier metal 28, and a metal film 30. The interelectrode insulating film 24 is provided between the floating gate electrode 20 and the control gate electrode 32. A first insulating film 40 is provided on the metal film 30.

The first polysilicon film 22 is formed with a polysilicon film in which an impurity is doped, for example. Boron (B) is doped with a concentration of approximately $1\times10^{20}$ to $10^{22}$ atms/cm$^3$ as an impurity, for example. Phosphorus (P) may be slightly doped as an impurity. A concentration of the phosphorus in this case is approximately $1\times10^{15}$ to $10^{17}$ atms/cm$^3$, for example. The interelectrode insulating film 24 is formed by an oxide nitride oxide (ONO) film which is formed by a laminated film of a silicon oxide film/silicon nitride film/silicon oxide film, for example. The barrier metal 28 is formed of tungsten nitride (WN), for example. The metal film 30 is formed of tungsten (W), for example. The first insulating film 40 is formed of a silicon nitride film, for example.

A second insulating film 42, a third insulating film 44, and an interlayer insulating film 46 are provided above the first insulating film 40. The second insulating film 42 is formed of a silicon oxide film, for example. The third insulating film 44 is formed of a silicon nitride film, for example. The interlayer insulating film 46 is formed of a silicon oxide film, for example.

In FIG. 4B, the element isolation area Sb, which isolates the element region Sa, is formed in the center portion of the drawing. The peripheral gate electrode PG is formed above the semiconductor substrate 10 through the gate insulating film 12. The peripheral gate electrode PG includes a third polysilicon film 34, the interelectrode insulating film 24, a fourth polysilicon film 36, the barrier metal 28, and the metal film 30. The third polysilicon film 34 configures a lower electrode of the peripheral gate electrode PG. The fourth polysilicon film 36, the barrier metal 28, and the metal film configure an upper electrode of the peripheral gate electrode PG. Both n-type impurities and p-type impurities are included in the third polysilicon film 34. Phosphorus or arsenic (As) and boron (B) are included in the third polysilicon film 34 as impurities, for example. Phosphorus (P) or arsenic (As) is included in the third polysilicon film 34 with a concentration of approximately $1\times10^{20}$ to $10^{22}$ atms/cm$^3$, for example. In addition, boron is included in the third polysilicon film 34 with a concentration of approximately $1\times10^{19}$ atms/cm$^3$, for example. Accordingly, the third polysilicon film 34 has n type conductivity. Phosphorus or arsenic is included in the fourth polysilicon film 36, for example, and the fourth polysilicon film has n type conductivity.

The impurity concentration in the polysilicon can be measured by secondary ion mass spectrometry (SIMS) analysis.

An opening portion 38 is provided on the interelectrode insulating film 24. The interelectrode insulating film 24 is removed in the opening portion 38, and the third polysilicon film 34 (or also referred to herein as a third polysilicon region 34) which is the upper electrode and the fourth polysilicon film 36 which is the lower electrode come in contact with each other and are electrically connected to each other. Accordingly, the peripheral circuit transistor PT is a transistor, which uses the electrode, which is positioned in the same layer as the floating gate electrode 20, as an electrode without being set in a floating state. The first insulating film 40, the second insulating film 42, the third insulating film 44, and the interlayer insulating film 46 are provided on the metal film 30.

As described above, in the first embodiment, the floating gate electrode 20 (first polysilicon film 22 or first polysilicon region 22) of the memory cell gate electrode MG is p type. Accordingly, when electrons are injected into the floating gate electrode 20, trapping characteristics of the electrons are improved and data retention characteristics are improved. Therefore, it is possible to reduce a range of variation of a threshold value of the memory cell gate electrode MG. Thus, it is possible to prevent erroneous read-out of written data.

In addition, in the peripheral gate electrode PG, the conductivity types of the third polysilicon film 34 and the fourth polysilicon film 36 are n type. Accordingly, it is possible to set the floating gate electrode 20 to the p type, while maintaining the peripheral circuit transistor PT as a surface channel. As a result, it is not necessary to change the peripheral circuit transistor to a buried channel according to the characteristics of the floating gate electrode 20, and the properties of the memory region and the peripheral circuit region are easily adjusted at the same time.

Manufacturing Method of First Embodiment

Next, a manufacturing method of the nonvolatile semiconductor memory device according to the first embodiment will be described with reference to FIGS. 4A to 13. FIGS. 4A to 11B are examples for describing the manufacturing method of the nonvolatile semiconductor memory device according to the first embodiment. Each of the figures having a label (A) in FIGS. 4A to 11B show a cross-sectional structure taken along line 4A-4A of FIG. 2, and shows a cross-sectional structure of the memory cell region. Each of the figures having a label (B) in FIGS. 4A to 11B shows a cross-sectional structure taken along line 4B-4B of FIG. 3, and shows a cross-sectional structure of the peripheral circuit transistor PT in the same step as each of the figures having a label (A).

Figure 5A:
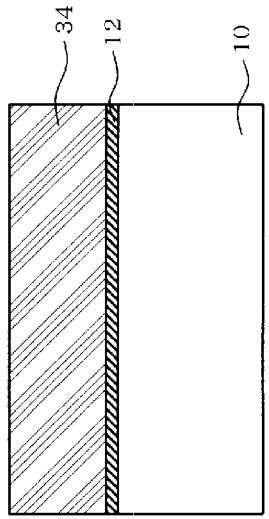
FIGS. 5A and 5B are an example of longitudinal cross-sectional views showing an intermediate step for describing a manufacturing step of a NAND-type flash memory device of the first embodiment.
Figure 5B:
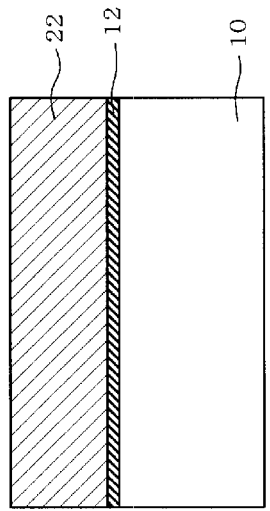

First, as shown in FIGS. 5A and 5B, the gate insulating film 12 is formed on the semiconductor substrate 10. A silicon oxide film can be used as the gate insulating film 12. The gate insulating film 12 may be formed by performing thermal oxidation of the semiconductor substrate 10 in a dry $O_2$ atmosphere at a temperature of approximately from 750° C. to 1000° C., for example. An oxynitride film may be formed as the gate insulating film 12, instead of the silicon oxide film. Next, a polysilicon film is formed on the gate insulating film 12. The polysilicon film can be formed by a CVD method. Next, an n-type impurity is selectively doped in the formation region (region shown in FIG. 5B) of the peripheral circuit transistor PT, using a lithography method and an ion injection (e.g., Ion implantation) method. Phosphorus or arsenic can be used as the impurity, for example. After that, thermal treatment is performed to activate the doped n-type impurity. The thermal treatment is performed in an atmosphere containing $O_2$ and $N_2$ at a temperature from 800° C. to 1100° C., for example. By performing this step, the first polysilicon film 22 in which an impurity is not doped is formed in the formation region (region shown in FIG. 5A) of the memory cell transistor MT, and the third polysilicon film 34 in which the n-type impurity is doped is formed in the formation region (region shown in FIG. 5B) of the peripheral circuit transistor PT. The first polysilicon film 22 in which boron is doped, for example, may be formed instead of the first polysilicon film 22 in which an impurity is not doped.

Figure 6A:
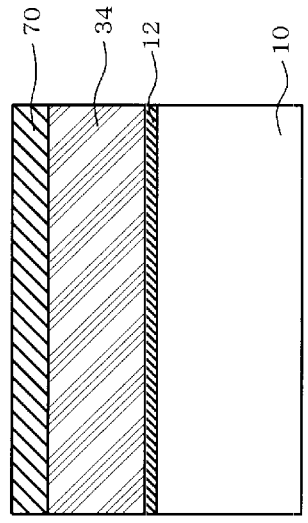
FIGS. 6A and 6B are an example of longitudinal cross-sectional views showing an intermediate step for describing a manufacturing step of a NAND-type flash memory device of the first embodiment.
Figure 6B:
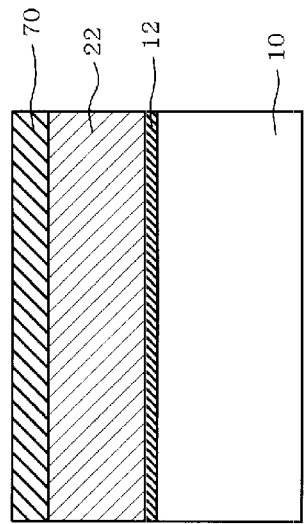

Next, as shown in FIGS. 6A and 6B, a mask insulating film 70 is formed on the entire surface. A silicon nitride film may be used as the mask insulating film 70, for example. The silicon nitride film may be formed using the CVD method, for example.

Next, as shown in FIGS. 7A and 7B, the mask insulating film 70, the first polysilicon film 22, the third polysilicon film 34, and the gate insulating film 12 are etched in this order, using the lithography method and a reactive ion etching (RIE) method. In addition, the semiconductor substrate 10 is etched and the element isolation groove 62 which is deeper than the lower surface of the gate insulating film 12 is formed. A region in which the element isolation groove 62 is formed is the element isolation area Sb, and a region which is isolated by the element isolation area Sb is the element region Sa.

Next, as shown in FIGS. 8A and 8B, the element isolation insulating film 60 is formed. The element isolation insulating film 60 is formed so as to bury the element isolation groove 62 and cover the upper portion of the mask insulating film 70. A silicon oxide film is used as the element isolation insulating film 60, for example. The element isolation insulating film 60 may be performed by forming a silicon oxide film which is a liner film by a CVD method, then applying a polysilazane solution by a spin coating method, and performing thermal treatment in a water-vapor atmosphere. The polysilazane is a polymer having a basic structure of —SiH$_2$—NH— and is converted into a silicon oxide film by annealing in the water-vapor atmosphere. Next, the element isolation insulating film 60 is polished by using a chemical mechanical polishing (CMP) method. The polishing of the element isolation insulating film 60 is stopped at a height of the upper surface of the mask insulating film 70 using the mask insulating film 70 as a polishing stop layer.

Figure 9A:
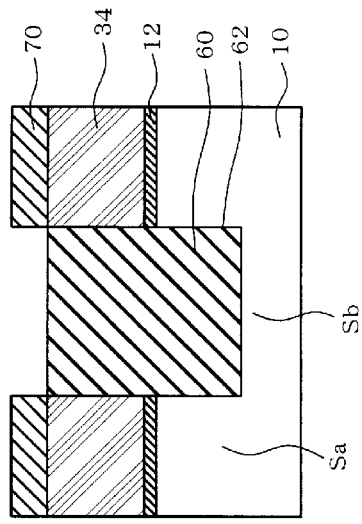
FIGS. 9A and 9B are an example of longitudinal cross-sectional views showing an intermediate step for describing a manufacturing step of a NAND-type flash memory device of the first embodiment.
Figure 9B:
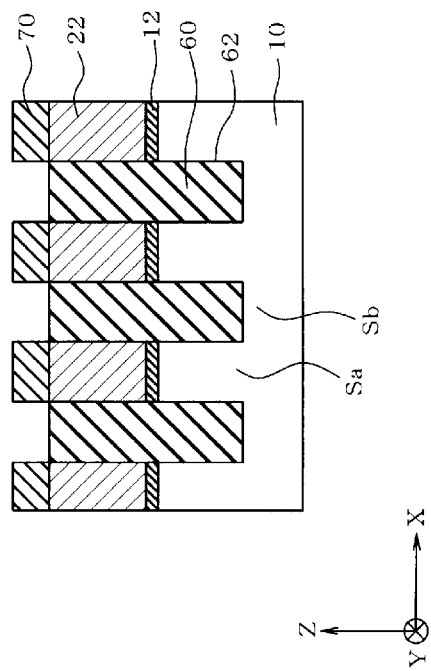

Next, as shown in FIGS. 9A and 9B, the element isolation insulating film 60 is etched back and a surface height of the element isolation insulating film 60 is set to be the same as a lower surface height (upper surface height of the first polysilicon film 22 and the third polysilicon film 34) of the mask insulating film 70. Etching-back can be performed by etching using the diluted hydrofluoric (HF) acid solution. An etching-back amount of the element isolation insulating film 60 is controlled by adjusting a process time of the etching performed by the diluted hydrofluoric acid solution. Etching performed by the RIE method may be used, instead of the etching performed by the diluted hydrofluoric acid solution.

Figure 10A:
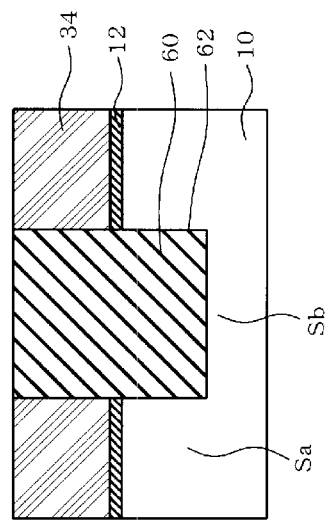
FIGS. 10A and 10B are an example of longitudinal cross-sectional views showing an intermediate step for describing a manufacturing step of a NAND-type flash memory device of the first embodiment.
Figure 10B:
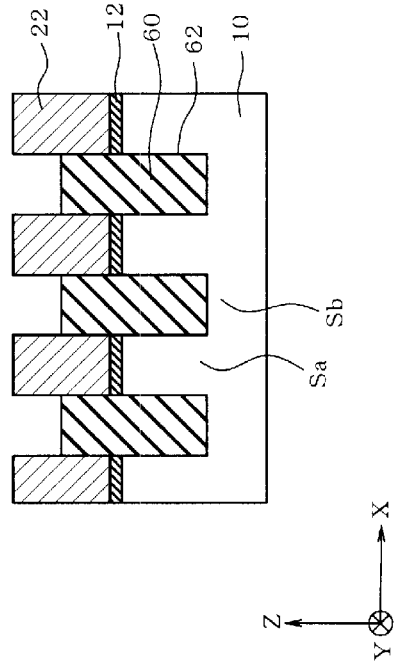

Next, as shown in FIGS. 10A and 10B, the element isolation insulating film 60 of the formation region (region shown in FIG. 10A) of the memory cell transistor MT is etched using the lithography method and the RIE method, and the upper surface height of the element isolation insulating film 60 is adjusted so as to be in a predetermined position lower than the upper surface of the first polysilicon film 22 and higher than the lower surface of the first polysilicon film 22. Then, the mask insulating film 70 is removed. The removing of the mask insulating film 70 may be performed by performing etching using phosphoric acid (hot phosphoric acid) which is heated to approximately 140° C., for example. By performing this step, a part of the upper surface and the side surface of the first polysilicon film 22 is exposed. In addition, the surface of the third polysilicon film 34 is exposed.

Then, the semiconductor substrate 10 on which the first polysilicon film 22, which has almost half of its upper surface and side surface exposed, and the third polysilicon film 34, which has an exposed surface, is exposed in an atmosphere containing impurity source gas at a temperature approximately from 500° C. to 1000° C. Accordingly, an impurity is doped in polysilicon materials (hereinafter, referred to as gas phase impurity doping method). Source gas containing boron can be used as the impurity source gas, and $BCl_3$, $BH_3$, $B_2H_6$, or BF based gas can be used, for example.

Herein, when boron is doped in the polysilicon films by the impurity doping method by gas, the inventors found the following phenomenon.

That is, when boron is doped in the polysilicon films, in which phosphorus or arsenic is previously doped, by the gas phase impurity doping method, the inventors found that only about $1 \times 10^{19}$ atms/cm$^3$ of boron is doped therein at most. Furthermore, the inventors found that, when this process sequence uses polysilicon in which phosphorus or arsenic is previously doped and a non-doped polysilicon, an n-type and a p-type polysilicon region is formed in a self-aligned manner without using complex process. The detailed descriptions are as follows.

When boron is doped in the non-doped polysilicon by the gas phase impurity doping method, boron can be doped in the polysilicon film to a concentration of about its solid solubility limit. In this case, the concentration of boron is approximately $1 \times 10^{20}$ to $1 \times 10^{22}$ atms/cm$^3$. In addition, in this case, even when phosphorus or arsenic is slightly mixed into the polysilicon film, the same effects are obtained. A slight concentration of phosphorus or arsenic may be approximately $1 \times 10^{15}$ to $1 \times 10^{17}$ atms/cm$^3$. Accordingly, in this case, since the concentration of boron is higher than the concentration of phosphorus or arsenic by more than three orders of magnitude, the polysilicon will achieve a p-type conductivity after performing the gas phase impurity doping method. In other words, in one example, the ratio of the concentration of phosphorous to the concentration of boron in the third polysilicon film 34 is greater than 1000.

On the other hand, if boron is doped by the gas phase impurity doping method in a polysilicon film in which phosphorus or arsenic is previously doped at about its solid solubility limit, not much boron is doped the polysilicon region after performing the gas phase impurity doping method. In this case, the concentration of phosphorus or arsenic may be approximately $1\times10^{20}$ to $1\times10^{22}$ atms/cm$^3$. In this case, the concentration of boron may only be approximately $1\times10^{19}$ atms/cm$^3$. Accordingly, in this case, since the concentration of phosphorus or arsenic is higher than the concentration of boron by more than a single order of magnitude, the polysilicon film has n-type conductivity. In other words, in one example, the ratio of the concentration of phosphorous to the concentration of boron in the third polysilicon film 34 is greater than 10.

As described above, when boron is injected by the gas phase impurity doping method, boron is sufficiently doped in the non-doped polysilicon and the polysilicon has a p-type conductivity. In the polysilicon region in which phosphorus or arsenic has been previously doped at about the solid solubility limit, the doping of boron using the gas phase impurity doping method is suppressed, and the polysilicon will have an n-type conductivity. That is, the region in which phosphorus or arsenic was previously doped will remain an n-type region and the non-doped region will become a p-type region, without the need for performing one or more lithography processes.

Even when the polysilicon in which boron is previously doped is used instead of the non-doped polysilicon, the same results will be obtained.

In one embodiment, previously, the first polysilicon film 22 includes polysilicon in which doping is not performed or boron is doped, and phosphorus or arsenic is doped within the third polysilicon film 34 to a concentration at about its solid solubility limit. Then, boron is doped in the polysilicon films using a gas phase doping process that is performed using a gas containing boron. Accordingly, boron is doped in the first polysilicon film 22 at a high concentration and the first polysilicon film will have a p-type conductivity. On the other hand, not much boron will be doped in the third polysilicon film 34 and the third polysilicon film will have an n-type conductivity.

In addition, boron previously diffused into a polysilicon film will diffuse to the outside surface, and thus a concentration of boron near the surface in the polysilicon will decrease, in some cases (out diffusion). Herein, although boron may be previously doped when forming the first polysilicon film 22 (step shown in FIGS. 5A and 5B), the concentration of the p-type impurity of the first polysilicon film 22 may be decreased by out diffusion, during the etch-back step (step shown in FIGS. 9A and 9B) of the element isolation insulating film 60. In this case, it may be advantageous to additionally dope boron into the first polysilicon film 22 by the gas phase impurity doping method. Accordingly, it is possible to maintain the peripheral circuit transistor as the surface type without additional processing, and improve the electrical property, for example the data retention characteristics, of the memory cell transistor MT.

Figure 12:
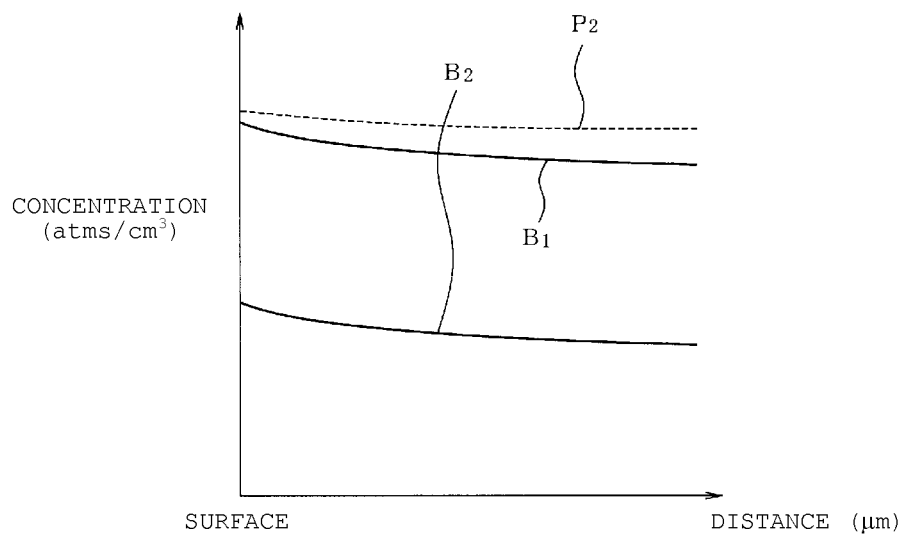
FIG. 12 is an example of a view showing an impurity profile of a floating gate electrode.

FIG. 12 is a graph illustrating an impurity concentration profile of the first polysilicon film 22 and the third polysilicon film 34 in the above example. In FIG. 12, a vertical axis shows an impurity concentration (atms/cm$^3$) and a horizontal axis shows a distance (μm) from the polysilicon surface. The vertical axis has a log scale and the horizontal axis has a linear scale. FIG. 12 shows the impurity concentration profile in a state after performing the activation of the impurity by performing a sufficient thermal treatment after performing the gas phase impurity doping process. FIG. 12 shows a case of using boron as the p-type impurity and a case of using phosphorus as the n-type impurity.

Concentration $B_1$ shows the impurity concentration profile of boron of the floating gate electrode 20 (first polysilicon film 22) in the formation region of the memory cell transistor MT. Concentration $P_2$ and $B_2$ show the impurity concentration profile of the third polysilicon film 34 in the formation region of the peripheral circuit transistor PT, in which the concentration $P_2$ shows the concentration profile of phosphorus and the concentration $B_2$ shows the concentration profile of boron. The phosphorus concentration profile in the first polysilicon film 22 in the formation region of the memory cell transistor MT is not shown since it is only a slight concentration as described above.

In FIG. 12, the concentration $B_1$, $P_2$, and $B_2$ have a profile which gradually decreases towards the interior from the surface of the polysilicon film and is generally substantially flat in the interior of the polysilicon film (e.g., no gradient in the concentration profile).

The boron concentration $B_1$ of the first polysilicon film 22 gradually decreases towards the inside from the surface of the polysilicon that may have a concentration in the range of about the solid solubility limit (e.g., $1\times10^{20}$ to $1\times10^{22}$ atms/cm$^3$). The phosphorus concentration range within the first polysilicon film 22 is may be between about $1\times10^{15}$ to $1\times10^{17}$ atms/cm$^3$. In the first polysilicon film 22, since the boron concentration is higher than the phosphorus concentration, by more than three orders of magnitude, the first polysilicon film will have a p-type conductivity.

The phosphorus concentration $P_2$ within the third polysilicon film 34 gradually decreases towards the interior from the surface of the polysilicon film, which may have a concentration in a range of about the solid solubility limit (e.g., $1\times10^{20}$ to $1\times10^{22}$ atms/cm$^3$). The boron concentration $B_2$ gradually decreases towards the interior from the surface of the polysilicon, which may have a concentration of about $1\times10^{19}$ atms/cm$^3$. Since the phosphorus concentration is higher than the boron concentration by more than a single order of magnitude, the third polysilicon film will have an n-type conductivity. The difference between the phosphorus concentration $P_2$ and the boron concentration B2 increases towards the interior of the polysilicon film.

As described above, when boron is doped using a gas phase impurity doping method into a polysilicon film in which phosphorus is doped in a concentration range of about the solid solubility limit of the polysilicon film, the doped boron concentration will be smaller than the phosphorus concentration by more than a single order of magnitude. Accordingly, the n-type/p-type polysilicon can be formed in a self-aligned manner without the need for lithography methods.

Therefore, compared to the case of forming the n-type/p-type polysilicon by an ion injection method (e.g., ion implantation method), for example, a lithography step used for categorizing the impurity kinds is not required, the number of processing steps is decreased, and the manufacturing cost is decreased.

In addition, the inventors found that, when performing the gas phase impurity doping method, the thickness of the silicon oxide film which is formed on the polysilicon in which phosphorus or arsenic is previously doped, is greater than the film thickness of the silicon oxide film which is formed on the non-doped polysilicon. The inventors found that, when using this processing technique, the polysilicon in which phosphorus or arsenic had been previously doped and the non-doped polysilicon are both formed, the n-type/p-type polysilicon doping can be advantageously formed in a self-aligned manner, by use of the difference between the thicknesses of the formed silicon oxide films. The detailed descriptions are as follows.

Figure 13:
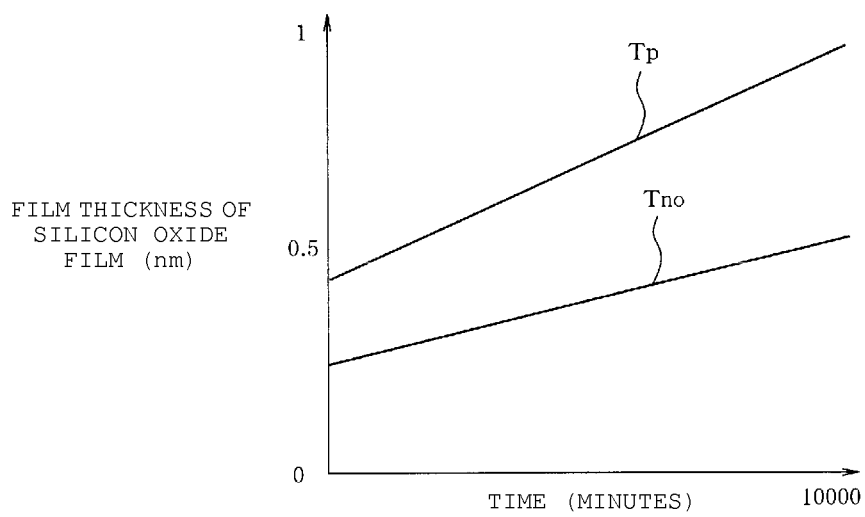
FIG. 13 is an example of a view showing an oxidation rate of polysilicon.

FIG. 13 is a view for describing impurity doping inhibition effects created by the presence of a silicon oxide film in the case where the gas phase impurity doping method was performed. In FIG. 13, a vertical axis shows the silicon oxide film thickness (nm) and a horizontal axis shows oxidation time (minutes). The vertical axis has a linear scale and the horizontal axis has a log scale. When using the gas phase impurity doping method, a silicon oxide film can be formed on a polysilicon surface if the polysilicon film is at room temperature or at a higher processing temperature. FIG. 13 shows an oxidation rate $T_p$ of polysilicon in which phosphorus is doped as an impurity and an oxidation rate $T_{no}$ of the non-doped polysilicon. FIG. 13 shows that the oxidation rate $T_p$ is greater than the oxidation rate $T_{no}$. When performing the process using the gas phase impurity doping method, the thickness of the silicon oxide film of the polysilicon film in which phosphorus is doped is greater than the thickness of the silicon oxide film of the non-doped polysilicon. The thicker the formed silicon oxide film the smaller the amount of the impurity that will be doped the polysilicon film during a gas phase impurity doping process. Since phosphorus is typically doped in the third polysilicon film 34 at a high concentration near the solid solubility limit, the formed silicon oxide film will be thicker as compared to the thickness of the silicon oxide film formed on the non-doped region. Accordingly, in the gas phase impurity doping method, the doping of boron is inhibited by the silicon oxide film, and hardly any boron is doped in the third polysilicon film 34. Therefore, the boron concentration in the third polysilicon film 34 can be decreased to less than the boron concentration in the first polysilicon film 22.

As described above, when doping boron by the gas phase impurity doping method, since the silicon oxide film which is formed on the non-doped polysilicon is thin, boron is sufficiently doped, and the silicon oxide film has p-type conductivity. Since the silicon oxide film which is formed on the polysilicon in the region in which phosphorus is doped is thick, doping of boron is inhibited and the boron concentration level is low after performing the gas phase impurity doping process, and the silicon oxide film has n-type conductivity. That is, the region in which phosphorus or arsenic had been previously doped and the non-doped polysilicon are both formed, the n-type/p-type polysilicon doping can be advantageously formed in a self-aligned manner, without using the lithography method.

In the formation region of the memory cell transistor MT, since a part of the upper surface and the side surface of the first polysilicon film 22 is exposed, boron can be doped in the first polysilicon film 22 in a conformal manner. Accordingly, the trapping characteristics of the electrons of the floating gate electrode 20 are improved and the data retention characteristics are improved.

By performing the step described above, the first polysilicon film 22 is formed to have p-type conductivity and the third polysilicon film 34 is formed to have n-type conductivity.

Next, as shown in FIGS. 11A and 11B, the interelectrode insulating film 24, the second polysilicon film 26 (fourth polysilicon film 36 in FIG. 11B), the barrier metal 28, the metal film 30, and the first insulating film 40 are formed. An ONO film, which is formed by the CVD method, can be used as the interelectrode insulating film 24, for example. A polysilicon film which is formed by the CVD method can be used as the second polysilicon film 26 and the fourth polysilicon film 36. Boron, for example, is doped in the formation region of the memory cell transistor MT to form the p-type second polysilicon film 26, and phosphorus or arsenic is doped in the formation region of the peripheral circuit transistor PT to form the n-type third polysilicon film 34. Tungsten nitride (WN) which is formed by a CVD method can be used as the barrier metal 28, for example. Tungsten which is formed by the CVD method can be used as the metal film 30, for example. A silicon nitride film which is formed by a CVD method can be used as the first insulating film 40, for example. Next, although not shown in the cross sections shown in FIGS. 11A and 11B, the films are patterned using the lithography method and the RIE method to form the memory cell gate electrode MG and the peripheral gate electrode PG. Then, the second insulating film 42, the third insulating film 44, and the interlayer insulating film 46 are formed in this order. A silicon oxide film which is formed by a CVD method can be used as the second insulating film 42, for example. A silicon nitride film which is formed by a CVD method can be used as the third insulating film 44, for example. A silicon oxide film which is formed by a CVD method using tetraethyl orthosilicate (TEOS) (tetraethoxy silane) as source gas can be used as the interlayer insulating film 46, for example.

Next, as shown in FIGS. 4A and 4B, the contact 54 which reaches the metal film 30 of the peripheral gate electrode PG from the surface of the interlayer insulating film 46 is formed. The contact 54 is formed using a lithography method and an RIE method. A tungsten film which is formed by a CVD method can be buried in the contact 54, for example. A wire 56 which is formed by tungsten, for example, is provided on the contact 54.

As described above, it is possible to form the NAND-type flash memory device 1 according to the first embodiment.

The following modifications can be performed in the first embodiment. A step of doping boron in the polysilicon by the gas phase impurity doping method can be performed after the step shown in FIGS. 5A and 5B. That is, after selectively doping the n-type impurity (for example, phosphorus) in the formation region of the peripheral circuit transistor PT and performing thermal treatment for activating the impurity, doping of the impurity (boron) by the impurity doping method by gas can be performed. Before doping the impurity by the gas phase impurity doping method, a dilute hydrofluoric acid process for removing a natural oxide film may be performed.

In addition, even when boron is doped in the polysilicon by performing the process in a plasma atmosphere containing the impurity instead of the gas phase impurity doping method, the same results can be obtained.

The step of selectively doping the n-type impurity (for example, phosphorus) in the formation region of the peripheral circuit transistor PT and performing the thermal treatment for activating thereof may be performed in the step shown in FIGS. 10A and 10B, after etching using the hot phosphoric acid and before doping the impurity (boron) by the impurity doping method by gas.

As described above, according to the manufacturing method of one embodiment, the polysilicon region containing the previously doped with phosphorus or arsenic and polysilicon region containing the non-doped polysilicon are formed. Therefore, the methods can provide an n-type region in the previously doped with phosphorus or arsenic region and a p-type polysilicon region in the previously non-doped polysilicon region using this self-aligned process. Therefore, since the lithography step can be removed from the process sequence, the number of steps can be decreased and the manufacturing cost can be decreased.

In addition, according to the gas phase impurity doping method, since boron exceeds the solid solubility limit in the polysilicon and extra boron will not be doped into the polysilicon, it is possible to suppress generation of non-activated excess boron and possible to suppress clustering. Accordingly, it is possible to suppress variation in the threshold value of the memory cell transistor MT.

Second Embodiment

Next, a detailed configuration of the NAND-type flash memory device 1 of a second embodiment will be described with reference to FIGS. 14A to 22C. The basic configuration of the NAND-type flash memory device 1 of the second embodiment is the same as the basic configuration of the first embodiment described in FIGS. 1 and 2. In addition, the planar layout pattern of the peripheral circuit transistor PT is the same as that described in FIG. 3. In the following description, the same reference numerals are used for the common parts with the first embodiment and the descriptions thereof are suitably omitted.

FIG. 14A is an example of a view schematically showing a cross-sectional structure of the memory cell transistor MT taken along section line 4A-4A of FIG. 2. FIG. 14C is an example of a view schematically showing a cross-sectional structure of the peripheral circuit transistor PT taken along section line 4B-4B of FIG. 3. The drawing shows a cross-sectional structure of two peripheral circuit transistors PT adjacent to each other in a gate length direction. FIG. 14B is an example of a view schematically showing a boundary portion of a region shown in FIG. 14A and a region shown in FIG. 14C.

In the configuration of the formation region of the memory cell transistor MT of FIG. 14A and configuration of the formation region of the peripheral circuit transistor PT of FIG. 14C, the first polysilicon film 22 in the floating gate electrode 20 may additionally contain carbon (C), nitrogen (N) or both of them. These elements are not contained in the third polysilicon film 34.

The process of doping the p-type impurity into the first polysilicon film 22, which has a p-type conductivity or is undoped, and doping the p-type impurity into the n-type impurity doped regions of the third polysilicon film 34 are the same as those discussed above.

By doping carbon or nitrogen or both of them in the first polysilicon film 22, a generation-recombination center (GR center) can be formed in the floating gate electrode 20 (first polysilicon film 22). When a voltage is applied with respect to the floating gate electrode 20 by capacitive coupling from the control gate electrode 32, a depletion layer is generated in the floating gate electrode 20. However, an electron-hole pair is easily generated from the formed GR center, and accordingly the depletion layer formed by voltage application hardly spreads. Therefore, it is possible to suppress a decrease in a coupling ratio due to spread of the depletion layer. The concentration of carbon and nitrogen in the polysilicon can be measured using infrared spectroscopy.

In addition, the first polysilicon film 22 may also contain an oxygen doped layer. The oxygen doped layer is a layer containing a small amount of oxygen which is formed in the first polysilicon film 22 by flowing a small amount of oxygen during the process of forming the first polysilicon film 22. The oxygen doped layer is a silicon-rich layer, and does not have insulating properties like a silicon oxide film. The oxygen doped layer can be a crystal dividing layer BN in FIG. 27A which divides a crystal boundary of the polysilicon, in some cases. With this oxygen doped layer, the GR center can be formed in the first polysilicon film 22. Accordingly, an effect of suppressing the spread of the depletion layer is obtained. The oxygen doped layer may be used with the doping of carbon and nitrogen described above. The first polysilicon film 22 may include a dividing layer BN, which is contained in each of the memory cell transistors that are formed in the same position. The dividing layer BN may be formed on a surface that faces a direction perpendicular to a main surface of the semiconductor substrate.

In addition, carbon (C) and nitrogen (N) are preferably not doped in the third polysilicon film 34. The oxygen doped layer is preferably not included in the third polysilicon film 34. That is, it can be said that the impurity concentration of carbon (C) and nitrogen (N) in the third polysilicon film 34 is lower than that of the first polysilicon film 22. As described above, by not doping carbon (C) or the like in the third polysilicon film 34, the resistivity of the third polysilicon film 34 can be decreased. As a result, it is possible to improve the electrical property of the memory cell transistor MT without delaying the operation of the peripheral circuit transistor.

As described above, according to the second embodiment, the first polysilicon film 22 has p-type conductivity and the third polysilicon film 34 has n-type conductivity, in the same manner as the first embodiment. Accordingly, the same effects as the first embodiment are obtained. Further, as described above, since doping with carbon or nitrogen or formation of the oxygen doped layer is performed in the first polysilicon film 22, the GR center is formed. Accordingly, the depletion layer formed by the voltage application hardly spreads, and it is possible to suppress a decrease in the coupling ratio due to the spread of the depletion layer.

Next, a manufacturing method of the nonvolatile semiconductor memory device according to the second embodiment will be described with reference to FIGS. 14A to 22C. FIGS. 14A to 22C are examples for describing the manufacturing method of the nonvolatile semiconductor memory device according to the second embodiment. Each of the figures having a label (A) in FIGS. 14A to 22C include a cross-sectional structure taken along section line 4A-4A of FIG. 2, and shows a cross-sectional structure of the memory cell region. Each of the figures having a label (C) in FIGS. 14A to 22C include a cross-sectional structure taken along line 4B-4B of FIG. 3, and shows a cross-sectional structure of the peripheral circuit transistor PT in the same step as each of the figures having a label (A). Each of the figures having a label (B) in FIGS. 14A to 22C include an example of a view showing a configuration of a boundary region of the figures having labels (A) and (B).

Figure 15A:
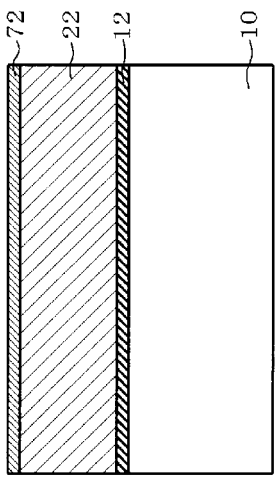
FIGS. 15A to 15C are an example of longitudinal cross-sectional views showing an intermediate step for describing a manufacturing step of a NAND-type flash memory device according to a second embodiment.
Figure 15B:
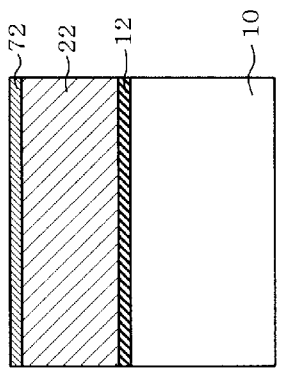
Figure 15C:
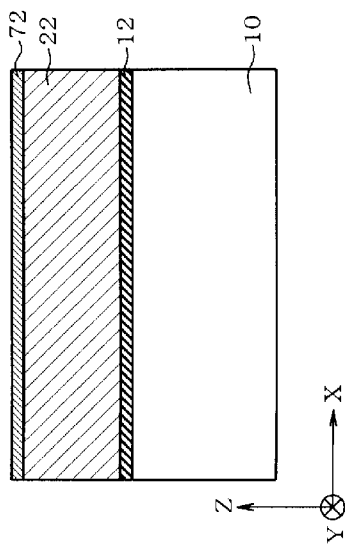

First, as shown in FIGS. 15A, 15B, and 15C, the gate insulating film 12, the first polysilicon film 22, and a fourth insulating film 72 are formed above the semiconductor substrate 10, in this order. A silicon oxide layer which is formed by the thermal oxidation method can be used as the gate insulating film 12, for example. The first polysilicon film 22 may be formed by the CVD method, for example. During the formation of the first polysilicon film 22 by the CVD method, carbon can be doped in the polysilicon by introducing a gas containing carbon during film forming gas. If a gas containing nitrogen is introduced instead of a gas containing carbon, it is possible to dope nitrogen into the polysilicon. In addition, if a gas containing carbon and a gas containing nitrogen are introduced with the film forming gas, it is possible to dope carbon and nitrogen into the polysilicon film during the forming process. Carbon and nitrogen may be doped in different portions in the polysilicon film to be formed, by differentiating the time for introducing the gas containing carbon and the gas containing nitrogen. The film is formed so that carbon or nitrogen is contained in a range of 5 nm to 35 nm from the upper surface (surface) of the first polysilicon film 22, for example. In addition, the concentration of carbon or nitrogen contained in the first polysilicon film 22 is $5 \times 10^{19}$ to $5 \times 10^{21}$ atms/cm$^3$.

In addition, when forming the oxygen doped layer, oxygen gas is introduced into the film forming gas for a predetermined time during the process of forming the polysilicon film. Accordingly, it is possible to form the oxygen doped layer in the polysilicon. Therefore, the growth of the crystal boundary of the polysilicon is temporarily stopped and the oxygen doped layer (crystal dividing layer BN in FIG. 27A), which divides the crystal is formed. Thus, the oxygen doped layer (crystal dividing layer BN) is formed in the same position as the first polysilicon film 22, in the floating gate electrode 20 included in the memory cell transistor MT. The first polysilicon film 22 may be formed as non-doped polysilicon in which an impurity is not doped, or may be formed as a polysilicon film which is formed while doping an impurity during the forming process. Boron can be used as an impurity, for example. A silicon oxide film or a silicon nitride film which is formed by a CVD method can be used as the fourth insulating film 72, for example.

Figure 16C:
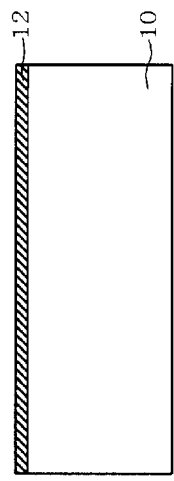
FIGS. 16A to 16C are an example of longitudinal cross-sectional views showing an intermediate step for describing a manufacturing step of a NAND-type flash memory of the second embodiment.
Figure 16B:
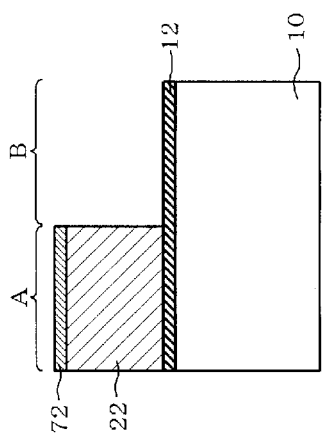
Figure 16A:
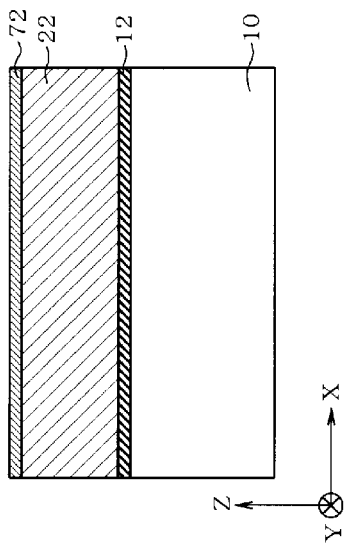

Next, as shown in FIGS. 16A, 16B, and 16C, the fourth insulating film 72 and the first polysilicon film 22, which are found in a region of the peripheral circuit transistor PT of FIG. 16C and a region B (region adjacent to the formation region of the peripheral circuit transistor PT) of the boundary region shown in FIG. 16B, is etched and removed using a lithography process and an RIE process. The etching process is performed using anisotropic conditions. The etching is stopped using the gate insulating film 12 as an etch stop.

Next, as shown in FIGS. 17A, 17B, and 17C, the third polysilicon film 34 is formed over the entire surface. The polysilicon, which is formed using a CVD method, can be used for the third polysilicon film 34. In the third polysilicon film 34, the step of doping carbon or nitrogen or forming an oxygen doped layer is not performed. As the third polysilicon film 34, a non-doped polysilicon film, in which an impurity is not doped, may be formed, or a polysilicon film which is formed while doping an impurity during the formation of the film. When the third polysilicon film 34 is formed as the non-doped polysilicon, the impurity can be doped by use of an ion injection method (e.g., ion implantation method) after forming the film. In this case, phosphorus or arsenic can be used as the impurity. Next, the thermal treatment for activation of the impurity is performed. Accordingly, the third polysilicon film 34 has n-type conductivity. Next, a resist 80 which covers the formation region of the peripheral circuit transistor PT shown in FIG. 17C and region B (region adjacent to the formation region of the peripheral circuit transistor PT) of the boundary region shown in FIG. 17B is formed.

Next, as shown in FIGS. 18A, 18B, and 18C, using the resist 80 as a mask, the third polysilicon film 34 on the formation region of the memory cell transistor MT and region A (region adjacent to the formation region of the memory cell transistor MT) of the boundary region is etched and removed by a RIE method. Isotropic etching conditions are typically used in this etching process, and the etching is stopped using the fourth insulating film 72 as an etch stop. Accordingly, the first polysilicon film 22 is formed in the formation region of the memory cell transistor MT and the region A of the boundary region. On the other hand, the third polysilicon film 34 is formed in the formation region of the peripheral circuit transistor PT and the region B of the boundary region. Since the entire surfaces of the first polysilicon film 22 and the third polysilicon film 34 in the boundary region shown in FIG. 18B are removed in a later step, a slight unevenness in the surface may be formed in this step.

Next, as shown in FIGS. 19A, 19B, and 19C, the fourth insulating film 72 is etched and removed. The etching process and removing process of the fourth insulating film 72 can be performed by a diluted hydrofluoric acid solution, for example. Accordingly, the surface of the first polysilicon film 22 and the surface of the third polysilicon film 34 are exposed.

Next, as shown in FIGS. 20A, 20B, and 20C, a mask insulating film 70 is formed on the entire surface. A silicon nitride film can be used to form the mask insulating film 70. The silicon nitride film may be formed by the CVD method.

Next, as shown in FIGS. 21A, 21B, and 21C, the mask insulating film 70, the first polysilicon film 22, the third polysilicon film 34, and the gate insulating film 12 are etched in this order using a lithography process and an RIE process. In addition, the semiconductor substrate 10 is etched and the element isolation groove 62 which is deeper than the lower surface of the gate insulating film 12 is formed. In the boundary region shown in FIG. 21B, the first polysilicon film 22 and the third polysilicon film 34 on the entire surface of this region are etched and removed, and the semiconductor substrate 10 is etched to form the element isolation groove 62.

Figure 22C:
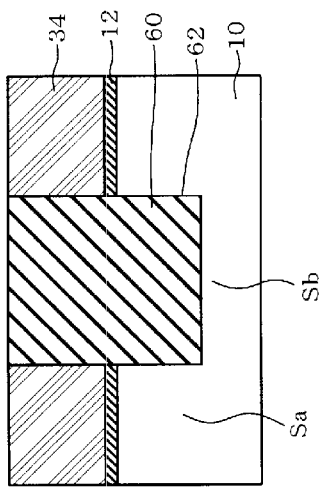
FIGS. 22A to 22C are an example of longitudinal cross-sectional views showing an intermediate step for describing a manufacturing step of a NAND-type flash memory of the second embodiment.
Figure 22B:
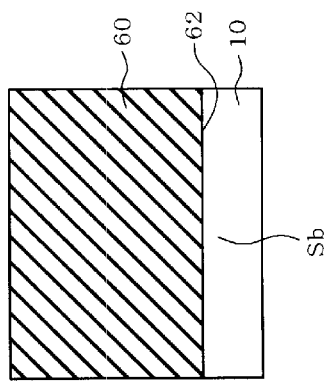
Figure 22A:
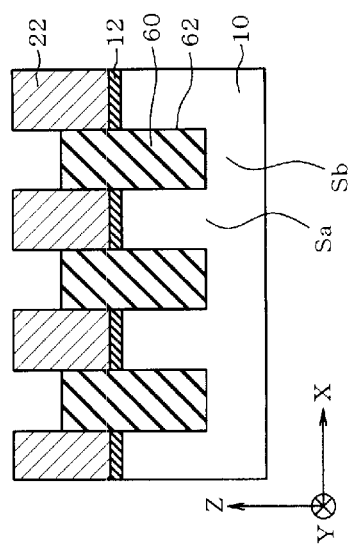

Next, by performing the steps of the manufacturing method of the first embodiment described in FIGS. 8A to 10B, a structure shown in FIGS. 22A, 22B, and 22C is formed. In FIG. 22A, almost half of the upper surface and the side surface of the first polysilicon film 22 are exposed. In FIG. 22B, the entire surface becomes the element isolation area Sb and the element isolation insulating film 60 is buried in the element isolation groove 62. In FIG. 22C, the upper surface of the third polysilicon film 34 is exposed. In this state, an impurity is doped by the gas phase impurity doping method. In the gas phase impurity doping method, the semiconductor substrate 10 is exposed in an atmosphere containing an impurity source gas at a temperature approximately from 500° C. to 1000° C. Accordingly, the impurity in the gas can be doped into the polysilicon film. Source gas containing boron can be used as the impurity source gas, and $BCl_3$, $BH_3$, $B_2H_6$, or BF based gas can be used, for example. Accordingly, in the same manner as the first embodiment, boron is doped in the first polysilicon film 22 at a concentration near the solid solubility limit, that is, approximately at $1 \times 10^{20}$ to $10^{22}$ atms/cm$^3$, so that the first polysilicon film 22 has a p-type conductivity. In this case, phosphorus or arsenic may be slightly mixed into the polysilicon material in the first polysilicon film 22.

On the other hand, phosphorus or arsenic may be previously doped in the third polysilicon film 34. If boron is doped by the gas phase impurity doping method, not much boron will be doped into polysilicon material. In this case, the concentration of phosphorus or arsenic may be approximately $1 \times 10^{20}$ to $10^{22}$ atms/cm$^3$. In addition, the concentration of boron is approximately equal to or less than $1 \times 10^{19}$ atms/cm$^3$. Accordingly, in this case, since the concentration of phosphorus or arsenic is higher than the concentration of boron by more than at least a single order of magnitude, the polysilicon has n-type conductivity.

Next, when performing the steps of the manufacturing method of the first embodiment described in FIGS. 11A and 11B and 4A and 4B, a structure as shown in FIGS. 14A, 14B, and 14C can be formed.

As described above, the NAND-type flash memory device 1 according to the second embodiment can be formed.

The following modifications can be performed in this embodiment. A step of doping boron in the polysilicon by the gas phase impurity doping method can be performed after the step shown in FIGS. 19A, 19B, and 19C. That is, after selectively doping the n-type impurity (for example, phosphorus or arsenic) in the formation region of the peripheral circuit transistor PT and performing a thermal treatment for activating the doped impurities, the gas phase impurity doping method can be performed. Before doping the impurity by the gas phase impurity doping method, a dilute hydrofluoric acid process for removing a natural oxide film may be performed.

In addition, even when boron is doped in the polysilicon film by a plasma doping process instead of the gas phase impurity doping method, the same effects may be obtained.

The step of selectively doping the n-type impurity (for example, phosphorus) in the formation region of the peripheral circuit transistor PT and performing the thermal treatment for activating thereof may be performed in the step shown in FIGS. 22A, 22B, and 22C, after etching using the hot phosphoric acid and before doping the impurity (for example, boron) by the impurity doping method by gas.

According to the manufacturing method of the second embodiment, the same effects as the manufacturing method of the first embodiment are obtained. In addition, since doping carbon or nitrogen or formation of the oxygen doped layer is performed on the first polysilicon film 22, which configures the floating gate electrode 20 of the memory cell gate electrode MG, the GR centers are formed. Accordingly, the depletion layer formed by the voltage application hardly spreads, and it is possible to suppress a decrease in the coupling ratio due to the spread of the depletion layer. As described above, it is possible to form the suitable first polysilicon film 22 on the floating gate electrode 20 and to form the n-type third polysilicon film 34 suitable for the peripheral circuit transistor PT in the formation region of the peripheral circuit transistor PT.

Third Embodiment

Next, a detailed configuration of the NAND-type flash memory device 1 of the third embodiment will be described with reference to FIGS. 23A to 26C. In the following description, the same reference numerals are used for the common parts with the first and second embodiments and the descriptions thereof are suitably omitted.

The basic configuration of the NAND-type flash memory device 1 of the third embodiment is the same as the basic configuration of the first embodiment described in FIGS. 1 and 2. In addition, the planar layout pattern of the peripheral circuit transistor PT is the same as that described in FIG. 3. The cross-sectional structure of the NAND-type flash memory device 1 of the third embodiment is the same as the configuration shown in FIGS. 14A, 14B, and 14C of the second embodiment.

In the third embodiment, the manufacturing method thereof is obtained by changing the steps of the manufacturing method of the second embodiment shown in FIGS. 15A to 18C to steps shown in FIGS. 23A to 26C. Hereinafter, the detailed description will be described with reference to FIGS. 23A to 26C.

Figure 23C:
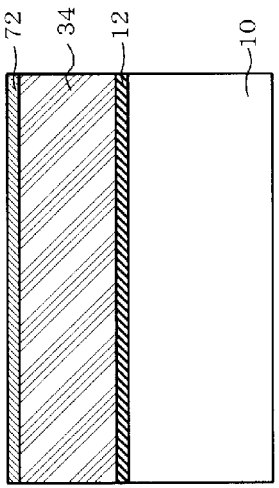
FIGS. 23A to 23C are an example of longitudinal cross-sectional views showing an intermediate step for describing a manufacturing step of a NAND-type flash memory of a third embodiment.
Figure 23B:
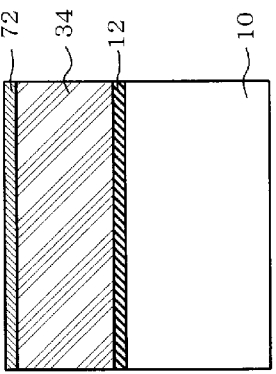
Figure 23A:
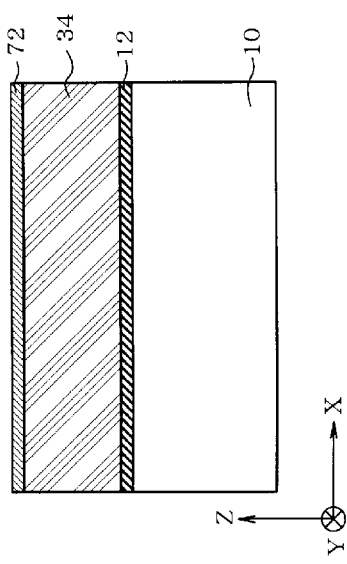

First, as shown in FIGS. 23A, 23B, and 23C, the gate insulating film 12, the third polysilicon film 34, and the fourth insulating film 72 are formed in this order on the semiconductor substrate 10. A silicon oxide layer which is formed by the thermal oxidation method can be used as the gate insulating film 12, for example. The third polysilicon film 34 can be formed by the CVD method, for example. In the third polysilicon film 34, carbon or nitrogen is not doped and the oxygen doped layer is not formed. As the third polysilicon film 34, a non-doped polysilicon film in which an impurity is not doped may be formed, or a polysilicon film, which is formed while doping an impurity during forming the film, may be formed. When the third polysilicon film 34 is formed as the non-doped polysilicon, the impurity (for example, phosphorus or arsenic) is doped by the ion injection method after forming the film. Next, the thermal treatment for activation of the impurity is performed. Accordingly, the third polysilicon film 34 has n-type conductivity. A silicon oxide film or a silicon nitride film which is formed by the CVD method can be used as the fourth insulating film 72, for example.

Next, as shown in FIGS. 24A, 24B, and 24C, the fourth insulating film 72 and the third polysilicon film 34, which are in a region from the formation region of the memory cell transistor MT of FIG. 24A to a region A (region adjacent to the formation region of the memory cell transistor MT) of the boundary region shown in FIG. 24B, are etched and removed using a lithography process and an RIE process. The etching process may be is performed using anisotropic conditions. The etching process may be stopped using the gate insulating film 12 as an etch stop.

Figure 25A:
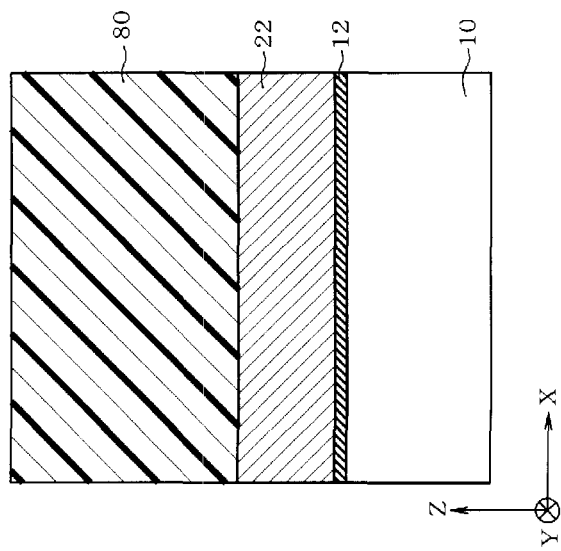
FIGS. 25A to 25C are an example of longitudinal cross-sectional views showing an intermediate step for describing a manufacturing step of a NAND-type flash memory of the third embodiment.
Figure 25B:
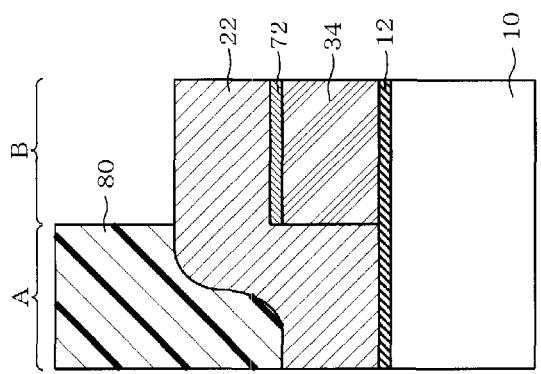
Figure 25C:
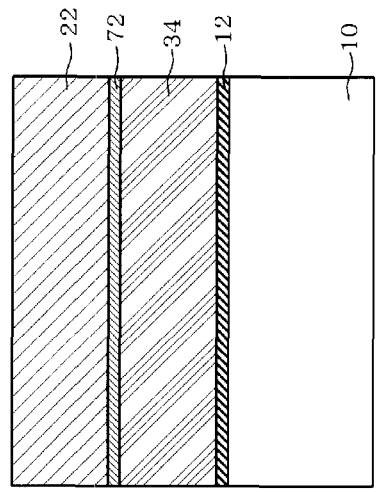

Next, as shown in FIGS. 25A, 25B, and 25C, the first polysilicon film 22 is formed over the entire surface. The polysilicon film 22 may be formed using a CVD method. During the formation of the first polysilicon film 22 by the CVD method, a gas containing carbon, nitrogen, or both is introduced into the film forming gas, and carbon or nitrogen, or both thereof can be doped into the polysilicon. In addition, the oxygen doped layer may be formed by introducing an oxygen gas during the formation of the first polysilicon film 22. The first polysilicon film 22 may be formed as non-doped polysilicon in which an impurity is not doped, or may be formed as a polysilicon film which is formed while doping an impurity (for example, boron) during the process of forming a film. Then, a resist 80, which covers the formation region of the memory cell transistor MT shown in FIG. 25A to the region A of the boundary region shown in FIG. 25B, is formed.

Next, as shown in FIGS. 26A, 26B, and 26C, using the resist 80 as a mask, the first polysilicon film 22 on the formation region of the peripheral circuit transistor PT and a region B of the boundary region is etched and removed by an RIE process. Anisotropic conditions may be used in this etching process, and the etching process may be stopped using the fourth insulating film 72 as an etch stop. Accordingly, the first polysilicon film 22 is formed in the formation region of the memory cell transistor MT and the region A of the boundary region. On the other hand, the third polysilicon film 34 is formed in the formation region of the peripheral circuit transistor PT and the region B of the boundary region.

Next, when performing the steps of the second embodiment described in FIGS. 19A to 22C and 14A and 14B, the NAND-type flash memory device 1 according to one embodiment is formed.

In the manufacturing method according to the second embodiment, an example of a process of previously forming the first polysilicon film 22 and then forming the third polysilicon film 34 is shown. With respect to this, in the manufacturing method according to the third embodiment, an example of a process of previously forming the third polysilicon film 34 and then forming the first polysilicon film 22 is shown.

As described above, according to the manufacturing method of the third embodiment, the same effects as the second embodiment can be obtained.

Other Embodiment

In the embodiments described above, the example in which the embodiment is applied to the NAND-type flash memory device as an example of the nonvolatile semiconductor memory device is shown, however, in addition thereto, the embodiment may be applied to a nonvolatile semiconductor memory device such as a NOR-type flash memory device or an EEPROM.

As the semiconductor substrate 10, in addition to the p-type silicon semiconductor substrate and the silicon substrate in which a p well is formed, a silicon on insulator (SOI) substrate including a p-type silicon region may be used.

An example in which the silicon oxide film is applied as the gate insulating film 12 is shown, however, a laminated structure such as $SiN/SiO_2$, $SiN/SiO_2/SiN$, $SiON/SiO_2/SiON$, $SiO_2/SiN/SiO_2$, $SiO_2$/high-dielectric-constant film/$SiO_2$, or high-dielectric-constant film/$SiO_2$ may be applied.

As a film configuration of the memory cell gate electrode MG or the peripheral gate electrode PG, a laminated structure of polycrystalline silicon, a metal compound of silicon (silicide), metal oxide, metal (including W, WSix, WN, Ni, NiSix, Co, CoSix, TaSiN, Ta, TaSix, TiSix, TiN, Pt, PtSix) or material thereof may be applied.

An example in which the ONO film is applied as the inter-electrode insulating film 24 is shown, however, a nitride-oxide-nitride-oxide-nitride (NONON) film or another insulating film having a high-dielectric constant may be applied. In addition thereto, a laminated film containing high-dielectric constant films such as a silicon oxide film, a silicon nitride film, a hafnium aluminate film (HfAlO), an alumina film ($Al_2O_3$), a magnesium oxide film (MgO), a strontium oxide film (SrO), a barium oxide film (BaO), a titanium oxide film ($TiO_2$), a tantalum oxide film ($Ta_2O_5$), a barium titanate film ($BaTiO_3$), a barium zirconate film (BaZrG), a zirconium oxide layer ($ZrO_2$), a hafnium oxide film ($HfO_2$), a yttrium oxide film ($Y_2O_3$), a zirconium silicate film (ZrSiG), a hafnium silicate film (HfSiG), a lanthanum aluminate film (LaAlO), or the like, or a single-layered film may be applied.

In addition, as the element isolation insulating film 60, an insulating film containing non-doped silicate glass (NSG), phosphorous silicon glass (PSG), boron silicon glass (BSG), polysilazane (PSZ), boron phosphorous silicon glass (BPSG), or high temperature oxide (HTO) may be used.

While the disclosure described herein primarily discusses the use of a polysilicon material to form one or more of the device elements disclosed herein, this configuration is not intended to be limiting as to the scope of the invention described herein, since other crystalline silicon material may also be used in some cases.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
    memory cell transistors including a floating gate and a control gate; and
    a peripheral circuit transistor including a lower electrode and an upper electrode, wherein
        the floating gate includes a first polysilicon region that includes a p-type semiconductor that is doped with boron,
        the lower electrode includes a second polysilicon region that includes an n-type semiconductor, the second polysilicon region of the lower electrode being doped with phosphorus and boron,
        a concentration of boron at a surface point of the second polysilicon region is higher than a concentration of boron at an inner point of the second polysilicon region, and
        a concentration of phosphorus at the surface point of the second polysilicon region is higher than a concentration of phosphorus at the inner point of the second polysilicon region.

2. The device according to claim 1,
    wherein a concentration of an n-type impurity in the second polysilicon region is between about $1\times10^{20}$ atms/$cm^3$ and about $1\times10^{22}$ atms/$cm^3$.

3. The device according to claim 1, wherein the second polysilicon region includes a concentration of phosphorus of between about $1\times10^{20}$ atms/$cm^3$ and about $1\times10^{22}$ atms/$cm^3$ and a concentration of boron of equal to or less than $1\times10^{19}$ atms/$cm^3$.

4. A nonvolatile semiconductor memory device comprising:
    memory cell transistors including a floating gate and a control gate; and
    a peripheral circuit transistor including a lower electrode and an upper electrode, wherein
        the floating gate includes a first polysilicon region that includes a p-type semiconductor that is doped with boron,
        the lower electrode includes a second polysilicon region that includes an n-type semiconductor, the second polysilicon region of the lower electrode being doped with phosphorus and boron,
        the second polysilicon region includes a concentration of boron and a concentration of phosphorus that both decrease in a direction extending from a surface of the second polysilicon region to a center region of the second polysilicon region.

5. The device according to claim 1, wherein the first polysilicon region includes one or more of the elements selected from a group consisting of carbon, nitrogen and oxygen.

6. The device according to claim 5,
    wherein a concentration of carbon or nitrogen contained in the first polysilicon region is between about $5\times10^{19}$ atms/$cm^3$ and about $5\times10^{21}$ atms/$cm^3$, and
    the carbon or nitrogen is disposed in a region between about zero and about 5 nm to 35 nm from a surface of the first polysilicon region.

7. The device according to claim 1, wherein the first polysilicon region further comprises a first doped region that has a concentration of carbon or nitrogen between about $5\times10^{19}$ atms/$cm^3$ and about $5\times10^{21}$ atms/$cm^3$, and the first doped region is disposed between a bottom surface of the first polysilicon region and a depth of 5 nm to 35 nm from the bottom surface of the first polysilicon region.

8. The device according to claim 1,
    wherein the first polysilicon region includes a dividing layer containing oxygen, and
    the dividing layer in each memory cell transistor is provided at a same distance from a main surface of a semiconductor substrate on which the memory cell transistors are provided.

9. A nonvolatile semiconductor memory device comprising:
    memory cell transistors including a floating gate and a control gate; and
    a peripheral circuit transistor including a lower electrode and an upper electrode, wherein the floating gate includes a first polysilicon region that includes a p-type semiconductor that is doped with boron, the lower electrode includes a second polysilicon region that includes an n-type semiconductor, the second polysilicon region of the lower electrode being doped with phosphorus and boron, and a ratio of a concentration of phosphorous to a concentration of boron in the second polysilicon region is greater than 10.

10. The device according to claim 1, wherein the first and second polysilicon regions further comprise a crystalline silicon material.

11. The device according to claim 1, wherein the surface point of the second polysilicon region is located on a surface that faces a main surface of a semiconductor substrate on which the memory cell transistors are provided.

* * * * *